United States Patent
Hung et al.

(10) Patent No.: US 8,064,268 B2
(45) Date of Patent: Nov. 22, 2011

(54) METHOD AND SYSTEM FOR A SERIAL PERIPHERAL INTERFACE

(75) Inventors: Chun-Hsiung Hung, Hsinchu (TW); Kuen-Long Chang, Mucha-Taipei (TW); Chia-He Liu, Taoyuan (TW)

(73) Assignee: Macronix International Co., Ltd., Hsinchu (TW)

( * ) Notice: Subject to any disclaimer, the term of this patent is extended or adjusted under 35 U.S.C. 154(b) by 74 days.

(21) Appl. No.: 12/564,789

(22) Filed: Sep. 22, 2009

(65) Prior Publication Data

US 2010/0007377 A1 Jan. 14, 2010

Related U.S. Application Data

(63) Continuation of application No. 11/969,856, filed on Jan. 4, 2008, now Pat. No. 7,613,049.

(60) Provisional application No. 60/884,000, filed on Jan. 8, 2007.

(51) Int. Cl.
*G11C 7/10* (2006.01)

(52) U.S. Cl. ......... 365/189.03; 365/189.04; 365/189.02; 365/189.18; 365/189.19; 365/193; 365/233.1; 365/233.19

(58) Field of Classification Search .............. 365/189.02, 365/189.03, 189.04, 189.18, 189.19, 193, 365/233.1, 233.19
See application file for complete search history.

(56) References Cited

U.S. PATENT DOCUMENTS

| | | | | |
|---|---|---|---|---|
| 5,673,233 A | | 9/1997 | Wright et al. | |
| 5,923,899 A | * | 7/1999 | Martin et al. | 710/8 |
| 5,966,723 A | * | 10/1999 | James et al. | 711/103 |
| 5,966,724 A | | 10/1999 | Ryan | |
| 5,970,069 A | * | 10/1999 | Kumar et al. | 370/402 |
| 6,243,797 B1 | | 6/2001 | Merritt | |
| 6,418,059 B1 | | 7/2002 | Kreifels et al. | |
| 6,892,269 B2 | * | 5/2005 | Polizzi et al. | 711/103 |
| 7,088,132 B1 | * | 8/2006 | Tang et al. | 326/39 |
| 7,095,247 B1 | * | 8/2006 | Tang et al. | 326/38 |
| 7,151,705 B2 | * | 12/2006 | Polizzi et al. | 365/201 |
| 7,277,973 B2 | | 10/2007 | Bando | |
| 7,281,082 B1 | * | 10/2007 | Knapp | 711/103 |
| 7,289,386 B2 | | 10/2007 | Bhakta et al. | |
| 7,397,717 B2 | * | 7/2008 | Chen et al. | 365/221 |
| 7,515,471 B2 | * | 4/2009 | Oh et al. | 365/185.11 |

(Continued)

OTHER PUBLICATIONS

Office Action of Chinese Application No. 2008100022950, dated Jun. 12, 2009, 3 pages total.

(Continued)

*Primary Examiner* — Viet Nguyen
(74) *Attorney, Agent, or Firm* — Kilpatrick Townsend & Stockton LLP

(57) ABSTRACT

An integrated circuit device includes a serial peripheral interface adapted for receiving a first command supporting an address of a first configuration, wherein the serial peripheral interface supports an address of a second configuration upon receipt of a second command, the second configuration being different from the first configuration. In a specific embodiment, the first and the second configurations are different in address length. In another embodiment, a second address cooperated with the second command has a first part and a second part, the second part comprising a plurality of byte addresses, each of the byte addresses being associated with a corresponding byte of data. In another embodiment, integrated circuit device also includes a mode logic circuit for controlling operations of the first command and the second command. Various other embodiments are also described.

26 Claims, 25 Drawing Sheets

Read Mode: Command Set

Read Command

| READ | 03 Hex |
|---|---|
| Fast Read | 0B Hex |
| Dual I/O read | BB Hex |
| Quad I/O read | 32 Hex |
| Dual I/O DDR read | BA Hex |
| Quad I/O DDR read | 33 Hex |
| Dual I/O page read | BC Hex |
| Dual I/O DDR page read | BD Hex |
| Dual I/O read with SRW | AE Hex |
| Dual I/O program with SRW | CE Hex |
| Dual I/O sector erase with SRW | CD Hex |
| Configuration register write | D1 Hex |

SRW: Simultaneously Read Write operation

U.S. PATENT DOCUMENTS

| | | | |
|---|---|---|---|
| 7,519,751 B2 * | 4/2009 | Perroni et al. | 710/107 |
| 7,532,537 B2 | 5/2009 | Solomon et al. | |
| 7,558,900 B2 * | 7/2009 | Jigour et al. | 710/305 |
| 7,599,205 B2 * | 10/2009 | Rajan | 365/63 |
| 7,613,049 B2 * | 11/2009 | Hung et al. | 365/189.04 |
| 7,660,177 B2 * | 2/2010 | Lee et al. | 365/221 |
| 2006/0067123 A1 | 3/2006 | Jigour et al. | |
| 2006/0143366 A1 | 6/2006 | Yang et al. | |

OTHER PUBLICATIONS

Notice of Allowance for U.S. Appl. No. 11/969,856, mailed on Jun. 26, 2009, 7 pages.

Requirement for Restriction/Election for U.S. Patent Application No. 11/969,856, mailed on May 7, 2009, 7 pages.

* cited by examiner

Read Mode: Command Set

Read Command

| | |
|---|---|
| READ | 03 Hex |
| Fast Read | 0B Hex |
| Dual I/O read | BB Hex |
| Quad I/O read | 32 Hex |
| Dual I/O DDR read | BA Hex |
| Quad I/O DDR read | 33 Hex |
| Dual I/O page read | BC Hex |
| Dual I/O DDR page read | BD Hex |
| Dual I/O read with SRW | AE Hex |
| Dual I/O program with SRW | CE Hex |
| Dual I/O sector erase with SRW | CD Hex |
| Configuration register write | D1 Hex |

SRW: Simultaneously Read Write operation

Figure 1B

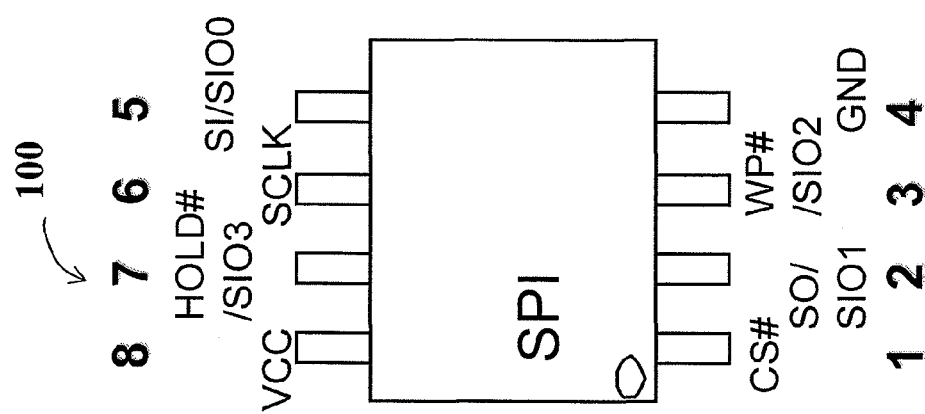

Figure 1A

Definition of Configuration Register

| Bit | Purpose | description |
|---|---|---|
| 7-4 | Dummy cycle count | 0001: 1 dummy cycle, 0010: 2 dummy cycles, 0011: 3 dummy cycles, 0100: 4 dummy cycles, 0101: 5 dummy cycles, 0110: 6 dummy cycles, 0111: 7 dummy cycles, 1000: 8 dummy cycles (default) |
| 3-1 | Burst length | 000: 4-byte burst, 001: 8-byte burst, 010: 16-byte burst, 100: 32-byte burst, 111: continuous burst (default) |
| 0 | Wrap around | 0: Wrap around, 1: No wrap around (default) |

Figure 16B

- x1 mode:
  - Pin#2 SO
  - Pin#3 WP#
  - Pin#5 SI
  - Pin#7 HOLD#
- x2 read mode:
  - Pin#2 SO/SIO1
  - Pin#3 WP#
  - Pin#5 SI/SIO0
  - Pin#7 HOLD#
- x4 read mode:
  - Pin#2 SO/SIO1
  - Pin#3 WP#/SIO2
  - Pin#5 SI/SIO0
  - Pin#7 HOLD#/SIO3
- Page/Burst read mode:
  - Pin#2 SO/SO1
  - Pin#3 WP#/SIO
  - Pin#5 SI/SI1
  - Pin#7 HOLD#/SO0

METHOD AND SYSTEM FOR A SERIAL PERIPHERAL INTERFACE

CROSS-REFERENCES TO RELATED APPLICATIONS

This application is a continuation application of U.S. patent application Ser. No. 11/969,856, titled "METHOD AND SYSTEM FOR A SERIAL PERIPHERAL INTERFACE," filed Jan. 4, 2008 now U.S. Pat. No. 7,613,049, which claims priority to U.S. Provisional Patent Application No. 60/884,000, titled "METHOD AND SYSTEM FOR A SERIAL PERIPHERAL INTERFACE PROTOCOL", filed Jan. 8, 2007, both of which are commonly owned and incorporated in their entirety by reference herein for all purposes.

BACKGROUND OF THE INVENTION

The present invention is directed to integrated circuits and their operation. More particularly, this invention provides a method and system for serial peripheral interface protocol for an integrated circuit which include memory device. Merely by way of example, the invention has been applied to serial memory devices for fast data transfer rate and for enabling simultaneously read/write operations. But it would be recognized that the invention has a much broader range of applicability. For example, the invention can be applied to other stand-alone or embedded memory devices such DRAM, SRAM, parallel flash, or other non-volatile memories.

Flash memories are used in a variety of applications in electronics. These memory devices often include a large number of input and output pins to accommodate data and addresses required to access the memory cells. In response to increasing space and wiring demands, serial flash memories have been developed to provide reduced pin counts, often requiring only one or two data pins. These serial flash memories provide a storage solution for systems with limited space, pin connections, and power supplies. Serial flash memories can be used for code download applications, as well as for storage of voice, video, text, and data, etc. However, conventional serial flash memory devices have many limitations. For example, a conventional serial peripheral interface flash memory device transfers data or address bits in a sequential and serial fashion, limiting the speed of the memory device.

From the above, it is seen that an improved technique for design of semiconductor memory devices is desired.

BRIEF SUMMARY OF THE INVENTION

The present invention is directed to integrated circuit memory devices and their operation. More particularly, this invention provides a method and system for serial peripheral interface protocol for integrated circuits which include memory devices. Merely by way of example, the invention has been applied to serial flash memory devices for improved data transfer rate and for enabling simultaneously read and write operations. But it would be recognized that the invention has a much broader range of applicability. For example, the invention can be applied to other stand-alone or embedded memory devices such DRAM, SRAM, parallel flash, or other non-volatile memories.

According to an embodiment of the present invention, a method is provided for dual I/O data read in an integrated circuit which includes a memory device. In a specific embodiment, the integrated circuit includes a flash memory device. In other embodiments, the method can be applied to integrated circuits which include other types of memory devices. In an embodiment, the integrated circuit includes a serial peripheral interface pin out configuration and a configuration register. In an embodiment, the configuration register includes a wait cycle count. The serial peripheral interface pin out configuration typically includes pin #1 (CS#), pin #2 (SO/SIO1), pin #3 (WP#), pin #4 (GND), pin #5 (SI/SIO0), pin #6 (SCLK), pin #7 (HOLD#), and pin #8 (VCC). The method includes applying a chip select signal coupled to pin #1 and transferring a dual I/O read instruction to the memory device using pin #5. The method includes transferring a read address to the memory device using pin #5 and pin #2 concurrently. The read address is associated with a location in the memory and includes at least a first address bit and a second address bit. The first address bit is transmitted using pin #5, and the second address bit is transmitted using pin #2. In a specific embodiment, the method uses a same clock edge to transmit the first address bit and the second address bit. The method also includes accessing data associated with the read address and waiting for a predetermined number of clock cycles. In an embodiment, the predetermined number of clock cycles is associated with the wait cycle count. The method includes transferring the data from the memory device using pin #5 and pin #2 concurrently. The data is associated with the read address and includes at least a first data bit and a second data bit. The first data bit is transmitted using pin #5, and the second data bit is transmitted using pin #2. According to embodiments of the invention, the transferring of the read address concurrently reduces address transfer clock cycles by one half. In an embodiment, the method also includes using a falling edge or a rising edge or both edges of a clock signal from pin #6 to trigger data transfer. In another embodiment, the method uses a falling edge or a rising edge or both edges of a first clock signal from pin #6 to trigger address transfer. In yet another embodiment, the method uses a falling edge or a rising edge or both edges of a first clock signal from pin #6 to trigger address transfer; and uses a falling edge or a rising edge or both edges of a second clock signal from pin #6 to trigger data transfer.

According to another embodiment, the present invention provides a method for quadruple I/O data read an integrated circuit which includes a memory device. In a specific embodiment, the integrated circuit includes a flash memory device. In other embodiments, the method can be applied to integrated circuits which include other types of memory devices. In an embodiment, the integrated circuit includes a serial peripheral interface pin out configuration and a configuration register. The configuration register includes a wait cycle count. The serial peripheral interface pin out configuration including pin #1 (CS#), pin #2 (SO/SIO1), pin #3 (WP#/SIO2), pin #4 (GND), pin #5 (SI/SIO0), pin #6 (SCLK), pin #7 (HOLD#/SIO3 #8 (VCC). The method includes applying a chip select signal coupled to pin #1, and transferring a quadruple I/O read instruction to the memory device using pin #5. The method also includes transmitting a read address to the memory device using pin #5, pin #2, pin #3, and pin #7 concurrently. The read address is associated with a location in the memory and includes at least a first address bit, a second address bit, a third address bit, and a fourth address bit. The first address bit is transmitted using pin #5, the second address bit is transmitted using pin #2, the third address bit is transmitted using pin #3, and the fourth address bit is transmitted using pin #7. In an embodiment, the transferring of the read address concurrently further includes using a same clock edge to transmit the first, second, third, and fourth address bits. In a specific embodiment, the transferring of the read address concurrently reduces address transfer clock cycles by ¾. The method then accesses data bits associated with the address in the memory device, and waits for a predetermined number of clock cycles, which is associated with the wait cycle count, and then transfers the data bits from the memory device using pin #5, pin #2, pin #3, and pin #7, concurrently. In a specific embodiment, the method uses a falling edge of a clock signal from pin #6 to trigger address transfer. In another embodiment, the method uses a falling edge or a rising edge or both edges of a first clock signal from pin #6 to trigger address transfer. In yet another embodiment, the method uses a falling edge or a rising edge or both edges of a first clock signal from pin #6 to trigger address transfer, and uses a falling edge or a rising edge or both edges of a second clock signal from pin #6 to trigger data transfer.

According to an alternative embodiment, the invention provides a method for dual I/O page read in an integrated circuit which includes a memory device. In a specific embodiment, the integrated circuit includes a flash memory device. In other embodiments, the method can be applied to integrated circuits which include other types of memory devices. In an embodiment, the integrated circuit includes a serial peripheral interface pin out configuration and a configuration register. The configuration register includes a wait cycle count. The serial peripheral interface pin out configuration includes pin #1 (CS#), pin #2 (SO/SO 1), pin #3 (WP#/SI0), pin #4 (GND), pin #5 (SI/SI1), pin #6 (SCLK), pin #7 (HOLD#/SO0), and pin #8 (VCC). The method includes applying a chip select signal coupled to pin #1 and transferring a dual I/O page read instruction to the memory device using pin #5. The method includes transferring a page address to the memory device using pin #5 and pin #3 concurrently. The page addresses includes a first part and a second part. The first part is associated with a page of data in the memory device, whereas the second part includes a plurality of byte addresses, each of which pointing to a corresponding byte in the page of data. The method includes accessing data associated with the page address in the memory device and waiting for a predetermined number of clock cycles, which is determined by the wait cycle count. The method then transfers the data in page mode from the memory device using pin #7 and pin #2 concurrently. In an embodiment, in one or more clock cycles, pin #5 and pin #3 are transferring address into the memory and pin #7 and pin #2 are transferring data out of the memory. In a specific embodiment, in one or more clock cycles, the method uses a falling edge or a rising edge or both edges of clock signal from pin #6 to trigger address transfer and data transfer.

According to another alternative embodiment, the inventions provides a method for dual I/O simultaneous read/write operation an integrated circuit which includes a memory device. In a specific embodiment, the integrated circuit includes a memory device. In other embodiments, the method can be applied to integrated circuits which include other types of memory devices. In an embodiment, the integrated circuit includes a serial peripheral interface pin out configuration and a configuration register. The configuration register includes a wait cycle count, a burst read length, and a wrap around indicator, and the serial peripheral interface pin out configuration includes pin #1 (CS#), pin #2 (SO/SO1), pin #3 (WP#/SI0), pin #4 (GND), pin (SI/SI1), pin #6 (SCLK), pin #7 (HOLD#/SO0), and pin #8 (VCC). The method includes applying a chip select signal coupled to pin #1, and performing a read operation. The read operation including the following processes.

transferring a read instruction to the memory device using pin #5;
   transferring an address to the memory device using pin #5 and pin #3 concurrently;
   accessing data associated with the address in the memory device; and
   transferring the data in burst mode from the memory device using pin #7 and pin #2 concurrently, a length of the data being determined by the burst read length.

The method also includes performing a write operation while the transferring of the data is being carried out using pin #7 and pin #2. The write operation includes the following processes.

transferring a write instruction to the memory device using pin #5;
   transferring a write address to the memory device using pin #5 and pin #3 concurrently;
   transferring write data to the memory device using pin #5 and pin #3 concurrently; and
   writing data to the memory device in memory locations associated with the write address.

In a specific embodiment, the method also includes repeating the transferring of the read data associated with the location in the memory if the wrap around indicator is set. In an embodiment, the method includes waiting for a predetermined number of cycles associated with the wait cycle count before transferring the read data in from the memory device. In a specific embodiment, in one or more clock cycles, the method uses a falling edge or a rising edge or both edges of clock signal from pin #6 to trigger address transfer and data transfer.

In yet another embodiment, the invention provides a method for dual I/O data read an integrated circuit which includes a memory device. In a specific embodiment, the integrated circuit includes a memory device. In other embodiments, the method can be applied to integrated circuits which include other types of memory devices. In an embodiment, the integrated circuit includes a clock signal, a plurality of pins, and a configuration register. The configuration register includes a wait cycle count, among other parameters. The method includes transmitting a read address to the memory device using a first pin and a second pin concurrently. The read address is associated with a location in the memory and includes at least a first address bit and a second address bit. In an embodiment, the first address bit is transmitted using the first pin, the second address bit is transmitted using the second pin. In a specific embodiment, the transferring of the read address concurrently further includes using a same clock edge to transmit the first address bit and the second bit. The method includes accessing the memory device for data associated with the address and waiting a predetermined number clock cycles. The predetermined number is associated with the wait cycle count. The method also includes transferring the data from the memory device using the first pin and the second pin concurrently. In an embodiment, the method uses a falling edge or a rising edge or both edges of the clock signal to trigger data transfer. In a specific embodiment, method uses a falling edge or a rising edge or both edges of the clock signal to trigger address transfer. In some embodiments, the method uses a first falling edge or a first rising edge or first both edges of the clock signal to trigger address transfer, and using a second falling edge or a second rising edge or second both edges of the clock signal to trigger data transfer.

In still another embodiment, the invention provides a method for quadruple I/O data read in an integrated circuit which includes a memory device. In a specific embodiment, the integrated circuit includes a memory device. In other embodiments, the method can be applied to integrated circuits which include other types of memory devices. In an embodiment, the integrated circuit includes a clock signal, a plurality of pins, and a configuration register. The configuration register includes a wait cycle count, among other parameters. The method includes transmitting a read address to the memory device using a first pin, a second pin, a third pin, and a fourth pin concurrently. The read address is associated with a location in the memory device, and includes at least a first address bit, a second address bit, a third address bit, and a fourth address bit. These address bits are transmitted concurrently, e.g., the first address bit being transmitted using the first pin, the second address bit being transmitted using the second pin, the third address bit being transmitted using the third pin, and the fourth address bit being transmitted using the fourth pin. The method includes accessing data associated with the read address in the memory device and waiting a predetermined number of clock cycles which is associated with the wait cycle count. The method includes transferring the data from the memory device using the first pin, the second pin, the third pin, and the fourth pin concurrently. In an embodiment, the transferring of the read address concurrently includes using a same clock edge to transmit the first, second, third, and fourth address bits. In a specific embodiment, the method uses a falling edge or a rising edge or both edges of the clock signal to trigger data transfer. In an embodiment, the method uses a falling edge or a rising edge or both edges of the clock signal to trigger address transfer. In some embodiments, the method uses a first falling edge or a first rising edge or first both edges of the clock signal to trigger address transfer, and using a second falling edge or a second rising edge or second both edges of the clock signal to trigger data bit transfer.

According to an alternative embodiment of the invention, a method is provided for dual I/O page read an integrated circuit which includes a memory device. In a specific embodiment, the integrated circuit includes a memory device. In other embodiments, the method can be applied to integrated circuits which include other types of memory devices. In an embodiment, the integrated circuit includes a clock signal and a plurality of pins. The method includes transmitting a first page read address to the memory device using a first pin and a second pin concurrently. The first page read address is associated with a location in the memory device. The method includes transferring data from the memory device using a third pin and a fourth pin concurrently. The data is associated with the first page read address in the memory device. The method includes transmitting a second page read address to the memory device using the first pin and the second pin concurrently, while continuing to transfer the data associated with the first page read address from the memory device using the third pin and the fourth pin concurrently. The method includes transferring data associated with the second page read address from the memory device using the third pin and the fourth pin concurrently.

In a specific embodiment of the method for page read, the first page read address includes a first part and a second part. The first part is associated with a page of data in the memory device, and the second part includes a plurality of byte addresses. Each of the byte addresses is associated with a corresponding byte in the page of data. In an embodiment, the first page read address includes at least a first address bit and a second address bit, the first address bit being transmitted using the first pin, the second address bit being transmitted using the second pin. In a specific embodiment, the integrated circuit memory device includes a configuration register which includes a wait cycle count, and the method includes waiting for a predetermined number of clock cycles before transferring data from the memory device. The predetermined number of clock cycles is associated with the wait cycle count. In an embodiment, the method uses a falling edge or a rising edge or both edges of the clock signal to trigger address transfer. In a specific embodiment, method uses a falling edge or a rising edge or both edges of the clock signal to trigger data transfer. In some embodiments, the method uses a falling edge or a rising edge or both edges of a clock signal to trigger address transfer and data transfer.

In still another embodiment, the invention provides a method for dual I/O simultaneous read/write operation an integrated circuit which includes a memory device. In a specific embodiment, the integrated circuit includes a memory device. In other embodiments, the method can be applied to integrated circuits which include other types of memory devices. In an embodiment, the integrated circuit includes a clock signal, a plurality of pins, and a configuration register. The configuration register includes a wait cycle count, a burst read length, and a wrap around indicator. The method includes entering a read command into the memory device using a first pin and transmitting a read address to the memory device using the first pin and a second pin concurrently. The read address is associated with a location in the memory device, and includes at least a first address bit and a second address bit. The first address bit is transmitted using the first pin, and the second address bit is transmitted using the second pin. The method includes accessing read data associated with the read address in the memory device. The method includes transferring the read data in burst mode from the memory device using a third pin and a fourth pin concurrently. The length of the read data is provided in the burst read length field of the configuration register. The method includes performing a write operation in the memory using the first pin and second pin while continuing to transfer the read data in burst mode using the third pin and the fourth pin. The write operation includes at least one of the following processes:

entering a write command into the memory device using the first pin;
 transferring a write address to the memory device using the first pin and the second pin concurrently;
 transferring write data to the memory device using the first pin and the second pin concurrently; and
 writing data to the memory device in the memory location associated with the write address.

In a specific embodiment of the method for simultaneous read/write operation, the method includes repeating the transferring of the read data associated with the location in the memory if the wrap around indicator is set. In an embodiment, the method includes waiting for a predetermined number of cycles before transferring the read data in from the memory device. In an example, the predetermined number of cycles is associated with the wait cycle count. In specific embodiments, the method uses a falling edge or a rising edge or both edges of a clock signal to trigger address transfer and data transfer.

An alternative embodiment of the present invention provides an integrated circuit device that includes a serial peripheral interface adapted for receiving a first command supporting an address of a first configuration, wherein the serial peripheral interface supports an address of a second configuration upon receipt of a second command, the second configuration being different from the first configuration. In a specific embodiment, the first and the second configurations are different in address length. In another embodiment, a second address cooperated with the second command has a first part and a second part, the second part comprising a plurality of byte addresses, each of the byte addresses being associated with a corresponding byte of data. In another embodiment, integrated circuit device also includes a mode logic circuit for controlling operations of the first command and the second command.

In another embodiment, of the integrated circuit device, the serial peripheral interface receives a first read address through a plurality of pins comprising a first input pin and a second input pin. In a specific embodiment, the serial peripheral interface further transfers data through a plurality of pins comprising a first output pin and a second output pin. In another specific embodiment, the serial peripheral interface further receives a second read address through the first input pin and the second input pin, while continuing to transfer data associated with the first read address. In another embodiment, the serial peripheral interface transfers data through a plurality of pins comprising a first output pin and a second output pin. In another embodiment, integrated circuit device also includes a configuration register for setting a length of data to be transferred in a burst mode operation. In a specific embodiment, the serial peripheral interface further receives a program command while transferring data in the burst mode.

Another alternative embodiment of the present invention provides a method for operating an integrated circuit device comprising a serial peripheral interface. The method includes a step of receiving, through the serial peripheral interface which is compliant with a first command for supporting an address of a first configuration, a second command. The method also includes a step of receiving, through the serial peripheral interface, an address of a second configuration, wherein the second configuration is different from the first configuration. In a specific embodiment, the first and the second configurations are different in address length. In another embodiment, the address of the second configuration includes a first part associated with a first memory segment and a second part associated with a second memory segment within the first memory segment. In a specific embodiment, the second memory segment is a byte.

In another embodiment of the above method, the serial peripheral interface receives a first read address through a plurality of pins comprising a first input pin and a second input pin. In a specific embodiment, the serial peripheral interface further transfers data through a plurality of pins comprising a first output pin and a second output pin. In another embodiment, the serial peripheral interface transfers data through a plurality of pins comprising a first output pin and a second output pin. In another specific embodiment, the serial peripheral interface further receives a second read address through the first input pin and the second input pin, while continues to transfer data associated with the first read address. In another specific embodiment, the method also includes receiving a program command while transferring data in the burst mode operation. In another embodiment, the method also includes a step of setting a configuration register of the integrated circuit device to determine a length of data to be transferred in a burst mode operation.

Another alternative embodiment of the present invention provides an integrated circuit device that includes an interface adapted to optionally receive a first command followed by an address of a first configuration or a second command followed by an address of a second configuration different from the first configuration. In a specific embodiment, the first and the second configurations are different in address length. In another embodiment, the integrated circuit device also has a mode logic circuit for controlling operation of the first command and the second command. In another embodiment, the interface receives a first read address through a plurality of pins comprising a first input pin and a second input pin. In a specific embodiment, the interface further transfers data through a plurality of pins comprising a first output pin and a second output pin. In another embodiment, the interface transfers data through a plurality of pins comprising a first output pin and a second output pin. In a specific embodiment, the interface further receives a second read address through the first input pin and the second input pin, while continues to transfer data associated with the first read address. In another embodiment, the integrated circuit device also includes a configuration register for setting a length of data to be transferred in a burst mode operation. In a specific embodiment of the integrated circuit device, the interface further receives a program command while transfers data in the burst mode.

Many benefits can be achieved by way of the present invention over conventional techniques. For example, in an embodiment, the present technique provides an easy to use method that relies upon conventional serial peripheral interface pin out technology. In certain embodiments, the data and address transfer rates are increased. In some embodiments, the method provides high speed and random read operation, for example, the page read method accessing individual bytes in a page. In certain embodiments, the invention provides methods for simultaneously read and program or erase operation. Depending upon the embodiment, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIG. 1A is a simplified pin out diagram for an integrated circuit which includes a serial peripheral interface I/O according to an embodiment of the present invention;

FIG. 1B is a simplified view diagram of read mode command set according to an embodiment of the present invention;

FIG. 16B is a simplified diagram of a configuration register bit assignment according to an embodiment of the present invention;

DETAILED DESCRIPTION OF THE INVENTION

Figure 2:
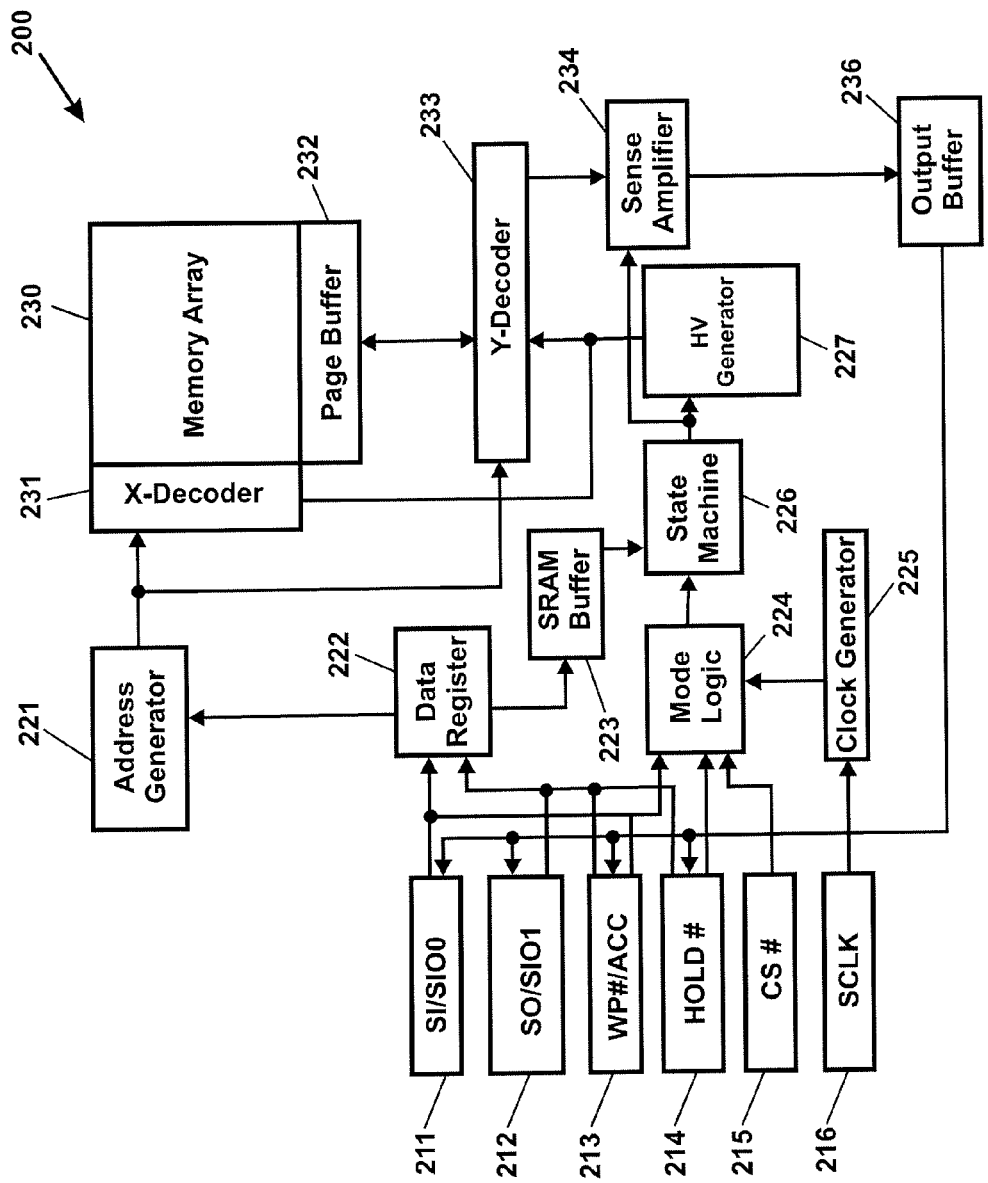
FIG. 2 is a simplified block diagram of an integrated circuit which includes a memory device according to an embodiment of the present invention.

The present invention is directed to integrated circuits and their operation. More particularly, this invention provides a method and system for serial peripheral interface protocol for integrated circuits which include memory devices. Merely by way of example, the invention has been applied to serial flash memory devices for improved data transfer rate and for enabling simultaneously read/write operations. But it would be recognized that the invention has a much broader range of applicability. For example, the invention can be applied to other stand-alone or embedded memory devices such as DRAM, SRAM, parallel flash, or other non-volatile memories.

Depending upon the embodiment, the present invention includes various features, which may be used. These features include the following:

- A high performance serial peripheral interface that has a higher data transmission rate;
- Random read operation by using the conventional serial peripheral interface pin-out;
- Simultaneously read/write operation by using the conventional serial peripheral interface pin-out;
- The address input and data output are simultaneously in operation in order to achieve higher data throughput and random read operation in the conventional serial peripheral interface pin-out;
- Configurable wait cycles are provided for different applications;
- Several read methods are defined to achieve high performance read. For example, the random read can be single bit random read, page mode random read or burst mode random read operation; and
- These high performance methods are applicable to low pin count application to flash memories, DRAM, SRAM, and other non-volatile memories.

As shown, the above features may be in one or more of the embodiments to follow. These features are merely examples, which should not unduly limit the scope of the claims herein. One of ordinary skill in the art would recognize many variations, modifications, and alternatives.

FIG. 1A is a simplified pin out diagram for an integrated circuit which includes a serial peripheral interface I/O according to an embodiment of the present invention. This diagram is merely an example, which should not unduly limit the scope of the claims herein. One of ordinary skill in the art would recognize other variations, modifications, and alternatives. As shown, according to a specific embodiment of the invention, integrated circuit device 100 includes pin #1 CS# (chip select), pin #2 SO (serial data out), pin #3 WP# (write protect), pin #4 GND (ground), pin #5 DI (serial data in), pin #6 SCLK (clock), pin #7 HOLD# (hold), and pin #8 VCC (power supply). In certain embodiments, pin #2 is designated at SO/SIO1, pin #3 is designated as WP#/SIO2, pin 5 is designated as SI/SIO0, and pin #7 is designated as HOLD#/SIO3. In other embodiments, pin #2 is designated at SO/SO1, pin #3 is designated as WP#/SI0, pin 5 is designated as SI/SI1, and pin #7 is designated as HOLD#/SO0. In the discussion below, these I/O pins are used in address and data transfers in various methods according to embodiments of the present invention.

FIG. 1B is a simplified view diagram of read mode command set according to an embodiment of the present invention. This diagram is merely an example, which should not unduly limit the scope of the claims herein. One of ordinary skill in the art would recognize other variations, modifications, and alternatives. As shown, the read mode command set includes the commands listed below in Table I according to a specific embodiment of the invention.

TABLE I

| Read | 03 Hex |
| --- | --- |
| Fast Read | 0B Hex |
| Dual I/O read | BB Hex |
| Quad I/O read | 32 Hex |
| Dual I/O DDR read | BA hex |
| Quad I/O DDR read | 33 Hex |
| Dual I/O page read | BC Hex |
| Dual I/O DDR page read | BD Hex |
| Dual I/O read with SRW | AE Hex |
| Dual I/O program with SRW | CE Hex |
| Dual I/O sector erase with SRW | CD Hex |
| Configuration register write | D1 Hex |

It is noted that SRW is used here to mean simultaneous read and write. Of course, there can be other variations, modifications, and alternatives. Various features will be discussed below.

FIG. 2 is a simplified block diagram of an integrated circuit which includes a memory device according to an embodiment of the present invention. This diagram is merely an example, which should not unduly limit the scope of the claims herein. One of ordinary skill in the art would recognize other variations, modifications, and alternatives. As shown, integrated circuit device 200 includes several input blocks coupled to respective input/output pins. In a specific embodiment, the integrated circuit device includes I/O pins consistent with the serial peripheral interface pin assignment. For example, device 200 may include I/O pins coupled to the following input/output circuit blocks.

SI/SIO0 pin coupled to SI/SIO0 block 211;
SO/SIO1 pin coupled to SO/SIO1 block 212,
WP#/ACC pin coupled to WP#/ACC block 213,
HOLD# pin coupled to HOLD# block 214, CS# pin coupled to CS# block 215, and SCLK pin coupled to SCLK block 216.

As shown in FIG. 2, device 200 also includes the following circuit blocks associated with the memory array 230.

Memory Array 230,

X-Decoder 231,

Page Buffer 232,

Y-decoder 233,

Sense Amplifier 234, and

Output Buffer 236.

Device 200 also includes the following control and support circuit blocks.

Address Generator 221,

Data Register 222,

SRAM Buffer 223,

Mode Logic 224,

Clock Generator 225,

State Machine 226, and

HV Generator 227.

Merely as examples, certain operations of device 200 are now discussed according to a specific embodiment of the present invention. System clock signal SCLK on input terminal 216 is coupled to Clock Generator 225, which in turn is coupled to Mode Logic 224. Mode Logic 224 is operably coupled to receive a chip select signal CS# on CS# input terminal 215. Commands or instructions may be input through input SI/SIO0 block 211 and then transferred to Data Register 222 and Mode Logic 224. Mode Logic 224, in combination with State Machine 226, interprets and executes the command such as a read, erase, or program operation. In an embodiment, Mode Logic 224 also receives a signal from WP#/ACC block 213 to perform a write protect function, and a signal from HOLD# block 214 to keep a clock signal from entering the State Machine 226.

According to a specific embodiment, data may be input through SI/SIO0 block 211, SO/SIO1 block 212, WP#/ACC block 213, and HOLD# block 214, which are coupled to Data Register 222. Data Register 222 is coupled to SRAM Buffer 223 for temporary storage. Data may be output through SI/SIO0 block 211, SO/SIO1 block 212, WP#/ACC block 213, and HOLD# block 214, which are coupled the Output Buffer 236. An address corresponding to a location in memory array 230 may be supplied from Data Register 222 to Address Generator 221. The address is then decoded by X-decoder 231 and Y-decoder 233. Page Buffer 232 is coupled to memory array 230 to provide temporary storage for memory operation. In a read operation, the data is transferred from memory array 230 through Sense Amplifier 234 to the Output Buffer 236. For write operation, data is transferred from Data Register to Page Buffer 232 and then written into Memory Array 230. For high voltage operation, e.g., for a write operation, High Voltage Generator 227 is activated.

Although the above has been shown using a selected group of components for the integrated circuit device, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification and more particularly below.

Figure 3:
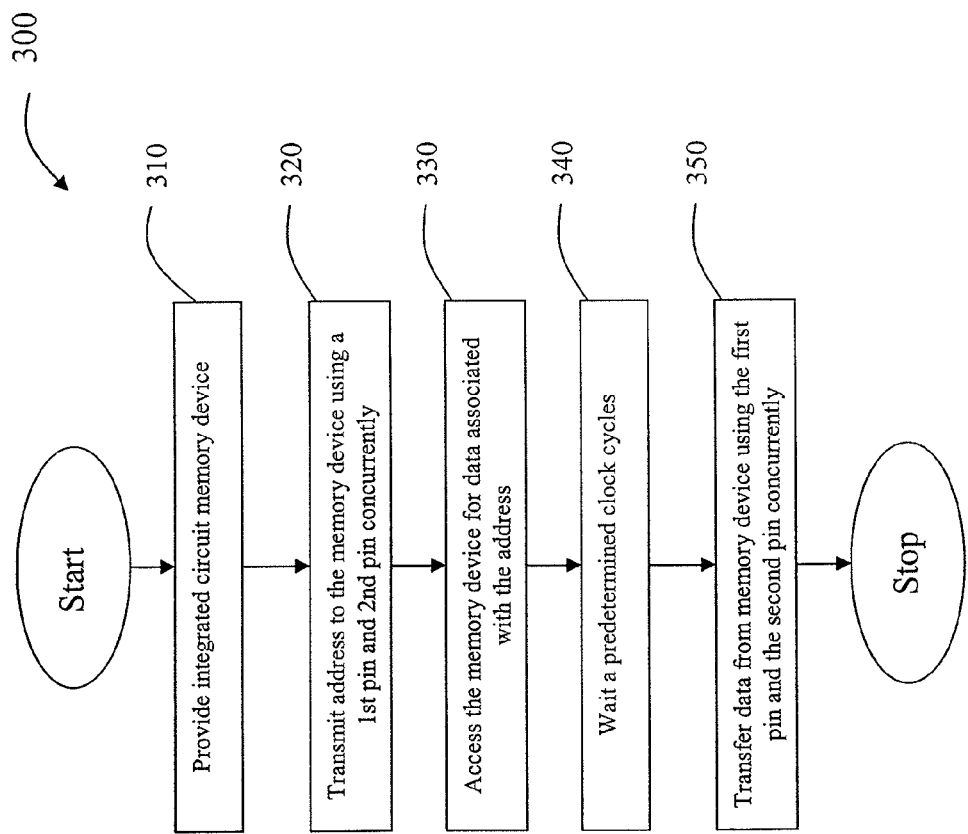
FIG. 3 is a simplified flow chart for a dual I/O memory read method according to an embodiment of the present invention.

FIG. 3 is a simplified flow chart for a dual I/O memory read method according to an embodiment of the present invention. This diagram is merely an example, which should not unduly limit the scope of the claims herein. One of ordinary skill in the art would recognize other variations, modifications, and alternatives. As shown, the method for the dual I/O memory read can be briefly outlined below.

1. (Process 310) Provide an integrated circuit memory device;
2. (Process 320) Transmit a read address to the memory device using a first pin and a second pin concurrently;
3. (Process 330) Access the memory device for data associated with the address;
4. (Process 340) Wait a predetermined number of clock cycles; and
5. (Process 350) Transfer the data from the memory device using the first pin and the second pin concurrently.

The above sequence of processes provides a dual I/O read method for a memory device according to an embodiment of the present invention. As shown, the method uses a combination of processes including a way of transmitting address information using two pins concurrently, and transferring data using two pins concurrently. Other alternatives can also be provided where processes are added, one or more processes are removed, or one or more processes are provided in a different sequence without departing from the scope of the claims herein. Further details of the present method can be found throughout the present specification and more particularly below with reference to FIGS. 4-7.

Figure 4:
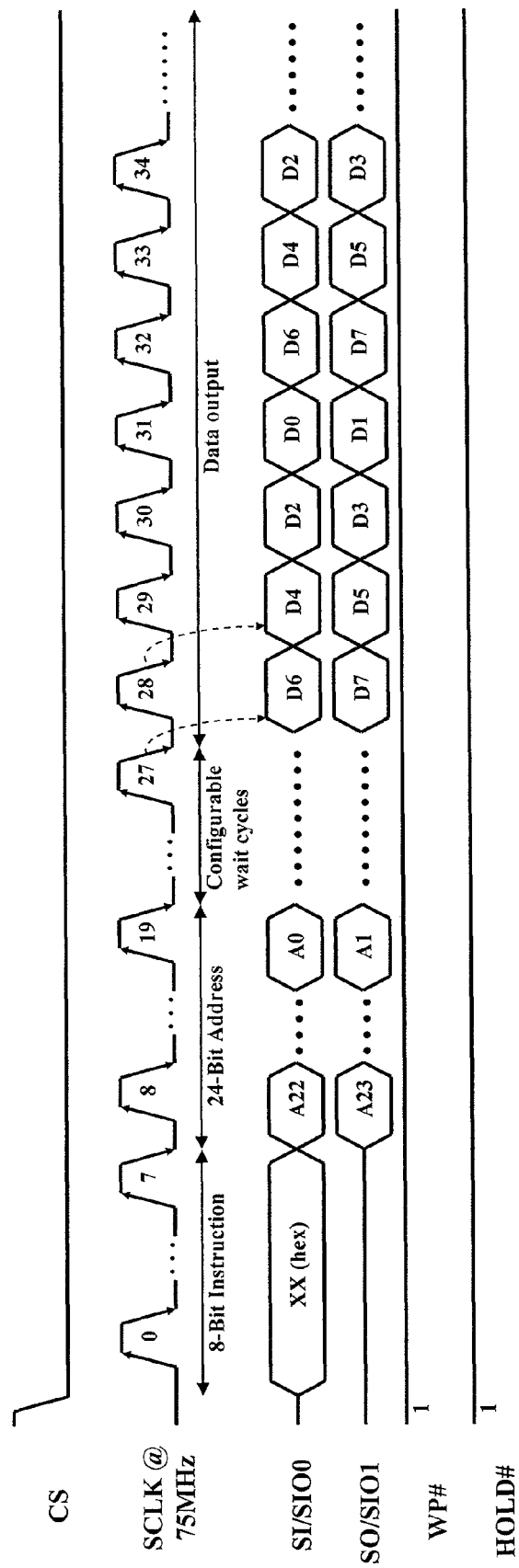
FIG. 4 is a simplified timing diagram for a fast Dual I/O SARSDR Read method according to an embodiment of the present invention.

FIG. 4 is a simplified timing diagram for a fast Dual I/O SARSDR Read method according to an embodiment of the present invention. This diagram is merely an example, which should not unduly limit the scope of the claims herein. One of ordinary skill in the art would recognize other variations, modifications, and alternatives. FIG. 4 includes timing diagrams for a fast dual I/O SARSDR read method for single address rate and single data rate read operation for an integrated circuit according to a specific embodiment of the invention. In this specific example, a clock rate of 75 MHz is used. In other embodiments, the clock rate may vary depending on the application. As shown, the CS# (chip select) signal is set to low, and an 8-bit instruction, designated as XX(hex), is transferred using the SI/SIO0 pin. In a specific embodiment, a 24-bit address A0, . . . , A23 is transferred using pin SI/SIO0 and pin SO/SIO1 simultaneously. In an embodiment, a number of configurable wait cycles are provided. The number of wait cycles is specified in a configuration register and can be selected according to the application. In FIG. 4, the configurable wait cycles are shown in clock cycles 20-27. In an embodiment, the memory device obtains data bits associated with the address. In an embodiment, data bits, for example, D0, . . . , D7 are transferred using pins SI/SIO0 and SO/SIO1 simultaneously at falling edges of the clock signal SCLK. For example, at the falling edge of clock pulse 27, data bit D6 is transferred at pin SI/SIO0 and data bit D7 is transferred at pin SO/SIO1 simultaneously. In a particular embodiment, the WP# pin and HOLD# pin are held at "1" as shown in FIG. 4. Of course, there can be other variations, modifications, and alternatives. For example, the address and data bits can be transferred on either a rising or falling edge of the clock.

Many benefits can be achieved by the embodiment shown in FIG. 4. For example, the transfer rate is doubled for both the address and the data. Referring to FIG. 4, after the chip select (CS#) signal is issued, the 24-bit address are transmitted into the memory device using two pins, SI/SIO0 and pin SO/SIO1, concurrently, in clock cycles 8-19. In this specific example, 12 clock cycles are used to transfer 24 bits of address information. A number of configurable wait cycles are elapsed, which allow the memory to process the command and prepare for receiving the input data. Data are then transmitted into the memory using two pins, SI/SIO0 and pin SO/SO1, concurrently. In contrast, conventional serial peripheral interface devices do not use multiple bits to transmit both address and data, and 24 clock cycles are needed to transfer a 24-bit address.

In an embodiment, a configurable wait period is provided after the transfer of address information. As an example, a wait cycle is shown as clock cycles 20-27 in FIG. 4. In a specific embodiment, the configurable wait period is provided in a configuration register. For example, in FIGS. 16A and 16B, bits 4-7 of the configuration register are used to designate the number of clock cycles for the wait cycles. In the specific embodiment shown in FIG. 16B, dummy cycles range from 1-8 clock cycles are provides. Depending on the embodiments, bits 4-7 of the configuration register can be used to specify 16 different clock cycles for the wait cycles or dummy cycles. Of course, other variations, modifications, and alternatives can be envisioned b one skilled in the art in view of this disclosure.

Figure 5:
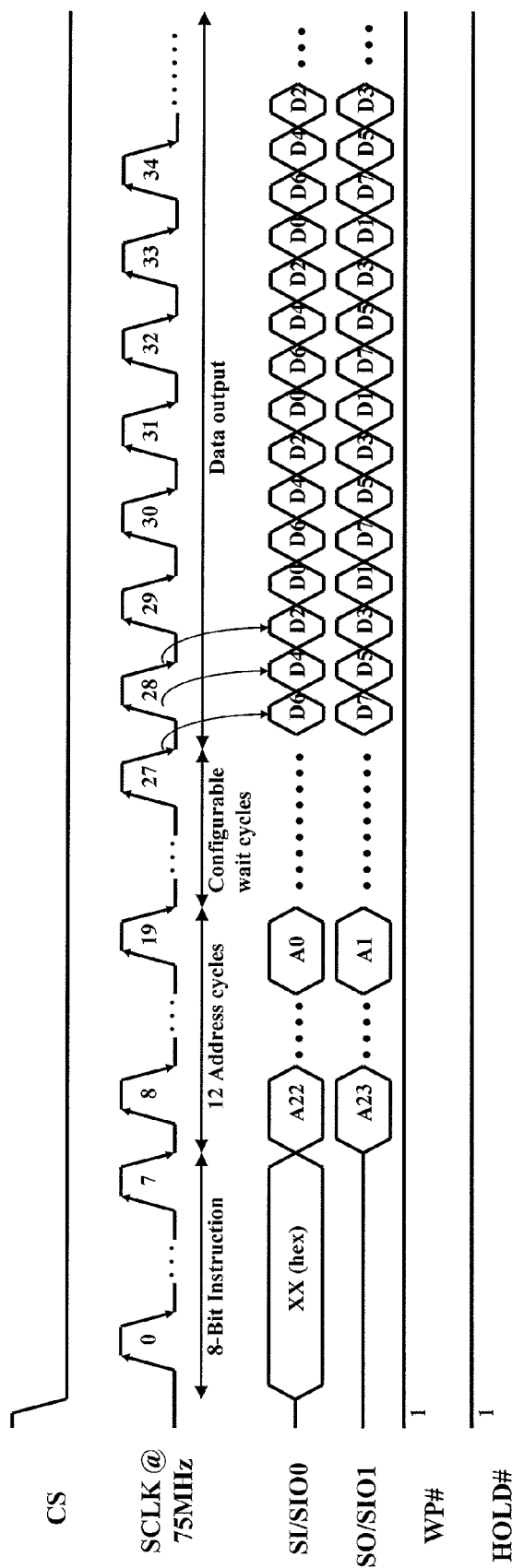
FIG. 5 is a simplified timing diagram for a fast Dual I/O SARDDR Read method according to an embodiment of the present invention.

FIG. 5 is a simplified timing diagram for a fast Dual I/O SARDDR Read method according to an embodiment of the present invention. This diagram is merely an example, which should not unduly limit the scope of the claims herein. One of ordinary skill in the art would recognize other variations, modifications, and alternatives. As shown, FIG. 5 includes timing diagrams for a fast dual I/O SARDDR read method for single address rate and double data rate read operation for an integrated circuit device according to a specific embodiment of the invention. In this specific example, a clock rate of 75 MHz is used. In other embodiments, the clock rate may vary depending on the application. As shown, the CS# (chip select) signal is set to low, and an 8-bit instruction, designated as XX(hex), is transferred using the SI/SIO0 pin. In a specific embodiment, a 24-bit address A0, . . . , A23 is transferred using pin SI/SIO0 and pin SO/SIO1 simultaneously. In an embodiment, a number of configurable wait cycles are provided. The number of wait cycles is specified in a configuration register and can be selected according to the application. In FIG. 5, the configurable wait cycles are shown in clock cycles 20-27. In an embodiment, the memory device obtains data bits associated with the address. In an embodiment, data bits are transferred using pins SI/SIO0 and SO/SIO1 simultaneously at falling and rising edges of the clock signal SCLK. For example, at the falling edge of clock pulse 27, data bit D6 is transferred at pin SI/SIO0 and data bit D7 is transferred at pin SO/SIO1. At the rising edge of clock pulse 28, data bit D4 is transferred at pin SI/SIO0 and data bit D5 is transferred at pin SO/SO1. At the falling edge of clock pulse 28, data bit D2 is transferred at pin SI/SIO0 and data bit D3 is transferred at pin SO/SIO1. Of course, there can be other variations, modifications, and alternatives.

Figure 6:
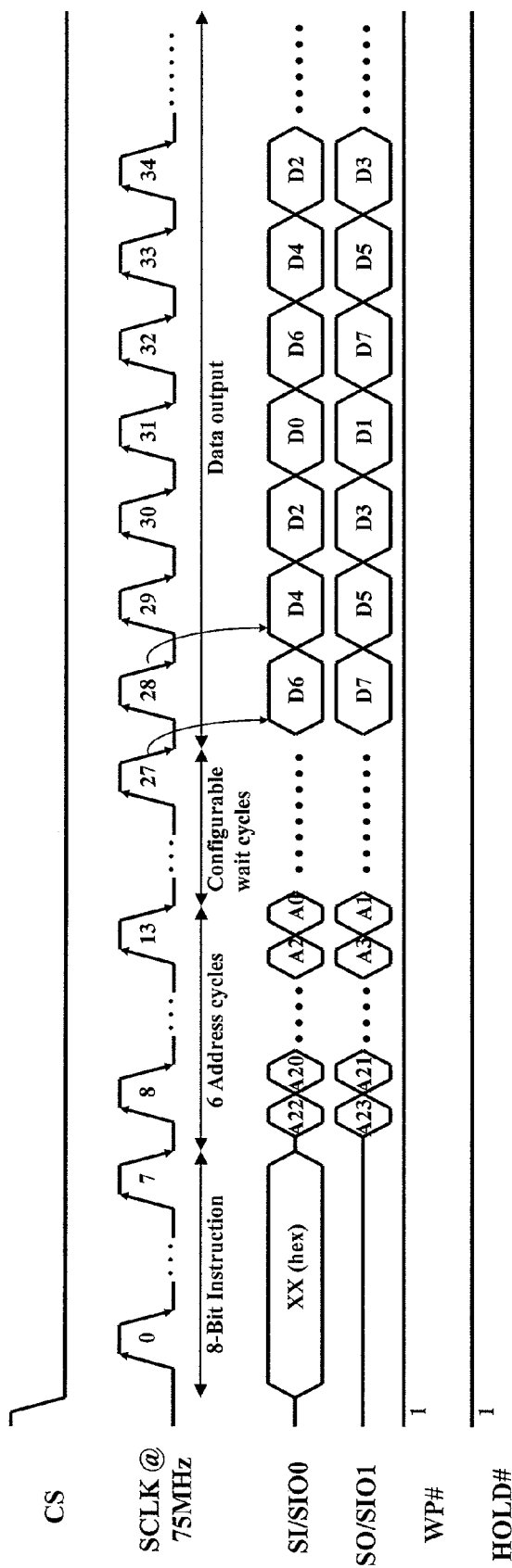
FIG. 6 is a simplified timing diagram for a fast Dual I/O DARSDR Read according to an embodiment of the present invention.

FIG. 6 is a simplified timing diagram for a fast Dual I/O DARSDR Read according to an embodiment of the present invention. This diagram is merely an example, which should not unduly limit the scope of the claims herein. One of ordinary skill in the art would recognize other variations, modifications, and alternatives. As shown, FIG. 6 includes timing diagrams for a fast dual I/O DARSDR read method for double address rate and single data rate read operation for a serial peripheral interface memory device according to a specific embodiment of the invention. In this specific example, a clock rate of 75 MHz is used. In other embodiments, the clock rate may vary depending on the application. As shown, the CS# (chip select) signal is set to low, and an 8-bit instruction, designated as XX(hex), is transferred using the SI/SIO0 pin. In a specific embodiment, a 24-bit address A0, . . . , A23 is transferred using pin SI/SIO0 and pin SO/SIO1 simultaneously, using both rising and falling edges of clock signal SCLK. The double address rate operation allows the address information to be transferred at a fast rate. For example, a 24-bit address information can be transferred in 6 clock cycles using both the rising edge and falling edge of the clock signal in the embodiment as shown in FIG. 6, whereas using only the rising edge or only the falling edge of the clock signal, the 24-bit address information is transferred in 24 clock cycles. Thus the number of clock cycles needed for address transfer can be reduced from 24 to 6, a reduction of 75%.

In an embodiment, a number of configurable wait cycles are provided. The number of wait cycles is specified in a configuration register and can be selected according to the application. In FIG. 6, the configurable wait cycles are shown in clock cycles 14-27. In an embodiment, the memory device obtains data bits associated with the address. In an embodiment, the memory device obtains data bits associated with the address. In an embodiment, data bits, for example, D0, . . . , D7 are transferred using pins SI/SIO0 and SO/SIO1 simultaneously at falling edges of the clock signal SCLK. For example, at the falling edge of clock pulse 27, data bit D6 is transferred at pin SI/SIO0 and data bit D7 is transferred at pin SO/SIO1. In a particular embodiment, the WP# pin and HOLD# pin are held at "1" as shown in FIG. 6. Of course, there can be other variations, modifications, and alternatives.

Figure 7:
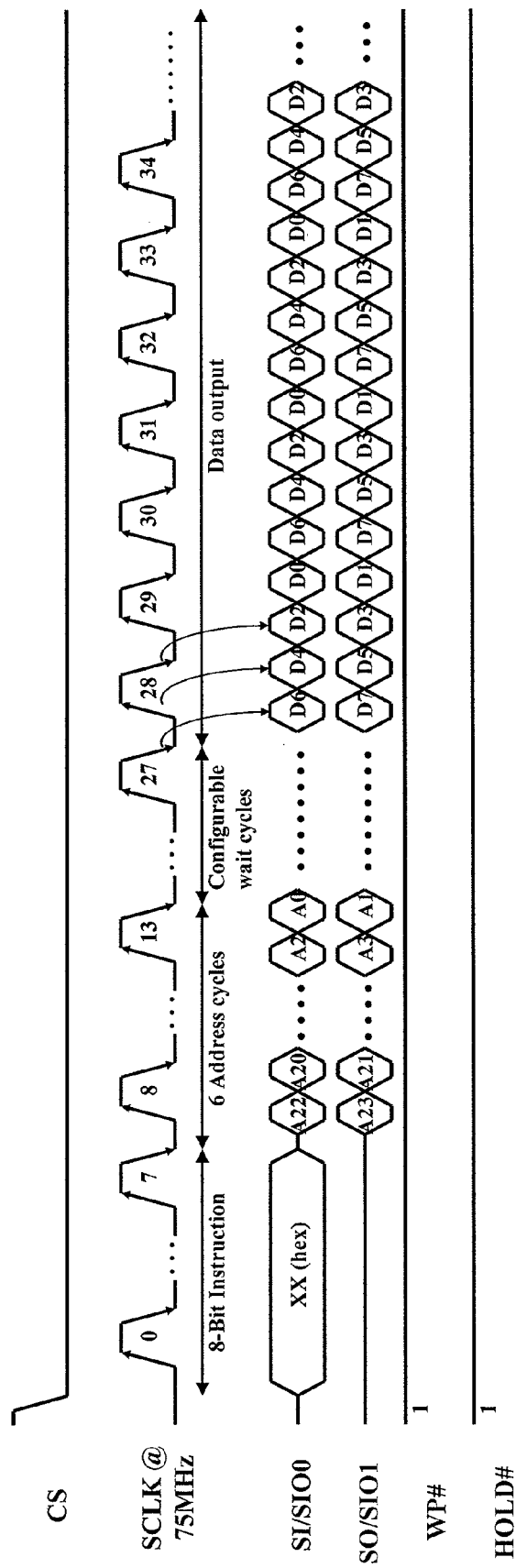
FIG. 7 is a simplified timing diagram for a fast Dual I/O DARDDR Read according to an embodiment of the present invention.

FIG. 7 is a simplified timing diagram for a fast Dual I/O DARDDR Read according to an embodiment of the present invention. This diagram is merely an example, which should not unduly limit the scope of the claims herein. One of ordinary skill in the art would recognize other variations, modifications, and alternatives. As shown, FIG. 7 includes timing diagrams for a fast dual I/O DARSDR read method for double address rate and double data rate read operation for a serial peripheral interface memory device according to a specific embodiment of the invention. In this specific example, a clock rate of 75 MHz is used. In other embodiments, the clock rate may vary depending on the application. As shown, the CS# (chip select) signal is set to low, and an 8-bit instruction, designated as XX(hex), is transferred using the SI/SIO0 pin. In a specific embodiment, a 24-bit address A0, . . . , A23 is transferred using pin SI/SIO0 and pin SO/SO1 simultaneously, using both rising and falling edges of clock signal SCLK. In an embodiment, the memory device obtains data bits associated with the address. In an embodiment, data bits are transferred using pins SI/SIO0 and SO/SIO1 simultaneously at falling and rising edges of the clock signal SCLK. For example, at the falling edge of clock pulse 27, data bit D6 is transferred at pin SI/SIO0 and data bit D7 is transferred at pin SO/SIO1. At the rising edge of clock pulse 22, data bit D4 is transferred at pin SI/SIO0 and data bit D5 is transferred at pin SO/SIO1. At the falling edge of clock pulse 28, data bit D2 is transferred at pin SI/SIO0 and data bit D3 is transferred at pin SO/SIO1. In an embodiment, a number of configurable wait cycles are provided. The number of wait cycles is specified in a configuration register and can be selected according to the application. In FIG. 7, the configurable wait cycles are shown in clock cycles 14-27. Of course, there can be other variations, modifications, and alternatives.

Figure 8:
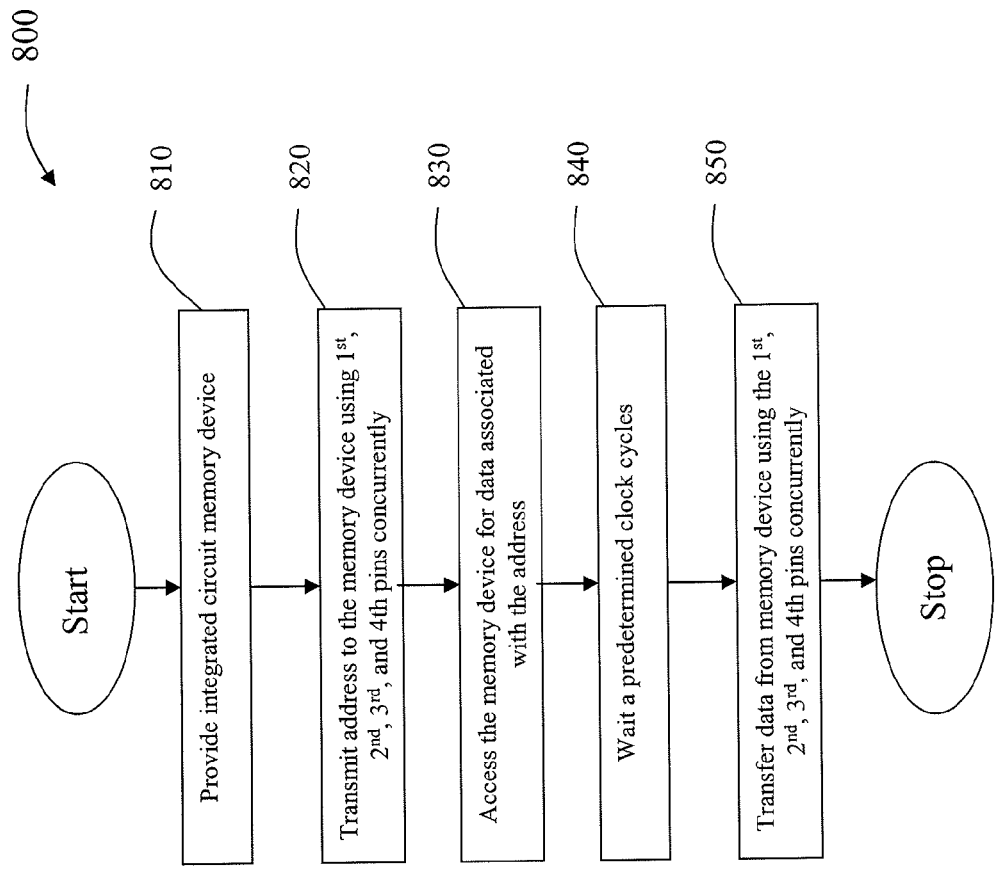
FIG. 8 is a simplified flow chart for a quadruple I/O memory read method according to an embodiment of the present invention.

FIG. 8 is a simplified flow chart for a quadruple I/O memory read method according to an embodiment of the present invention. This diagram is merely an example, which should not unduly limit the scope of the claims herein. One of ordinary skill in the art would recognize other variations, modifications, and alternatives. As shown, the method for the quadruple I/O memory read can be briefly outlined below.

1. (Process 810) Provide an integrated circuit memory device;

2. (Process 820) Transmit a read address to the memory device using a first pin, a second pin, a third pin, and a fourth pin concurrently;
3. (Process 830) Access data associated with the read address in the memory device;
4. (Process 840) Wait a predetermined number of clock cycles; and
5. (Process 850) Transfer the data from the memory device using the first pin, the second pin, the third pin, and the fourth pin concurrently.

The above sequence of processes provides a quadruple I/O page read method for a memory device according to an embodiment of the present invention. As shown, the method uses a combination of processes including a way of transmitting address information using four pins concurrently, and transferring data using four pins concurrently. Other alternatives can also be provided where processes are added, one or more processes are removed, or one or more processes are provided in a different sequence without departing from the scope of the claims herein. Further details of the present method can be found throughout the present specification and more particularly below with reference to FIGS. 9-12.

Figure 9:
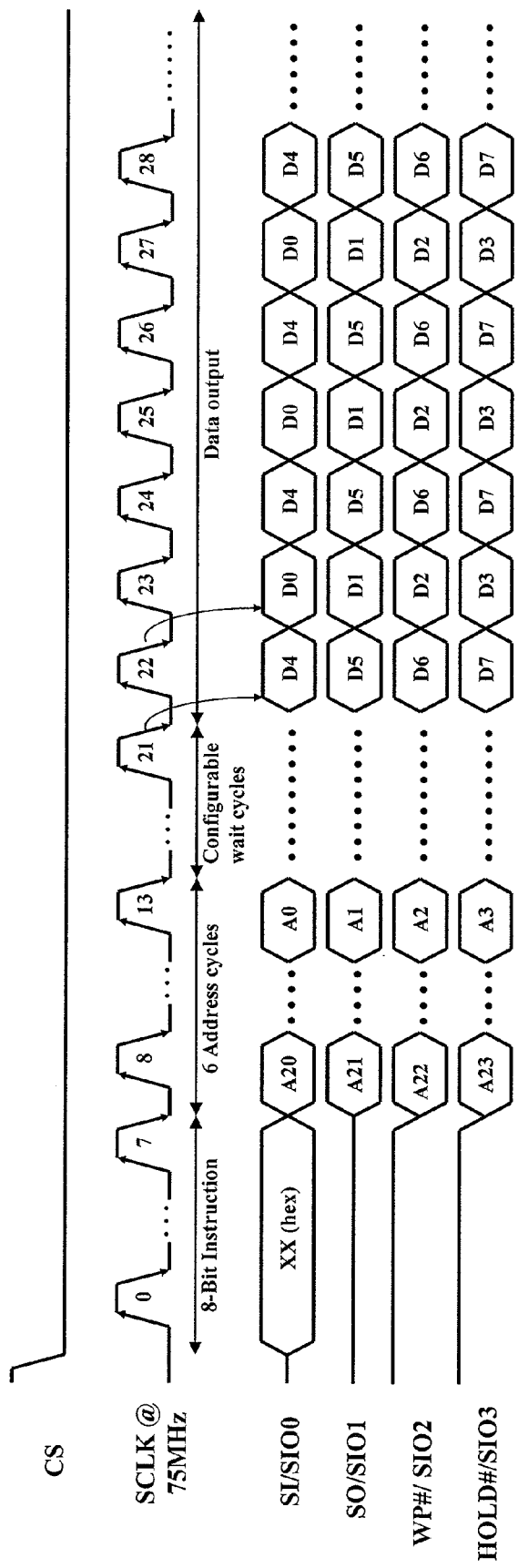
FIG. 9 is a simplified timing diagram for a fast Quadruple I/O SARSDR Read method according to an embodiment of the present invention.

FIG. 9 is a simplified timing diagram for a fast Quadruple I/O SARSDR Read method according to an embodiment of the present invention. This diagram is merely an example, which should not unduly limit the scope of the claims herein. One of ordinary skill in the art would recognize other variations, modifications, and alternatives. As shown, FIG. 9 includes timing diagrams for a fast quadruple I/O SARSDR read method for single address rate and single data rate read operation for a serial peripheral interface memory device according to a specific embodiment of the invention. In this specific example, a clock rate of 75 MHz is used. In other embodiments, the clock rate may vary depending on the application. As shown, the CS# (chip select) signal is set to low, and an 8-bit instruction, designated as XX(hex), is transferred using the SI/SIO0 pin. In a specific embodiment, a 24-bit address A0, . . . A23 is transferred using pin SI/SIO0, pin SO/SO1, pin WP#/SIO2, and pin HOLD#/SIO3 simultaneously, using rising edges of clock signal SCLK. For example, at the rising edge of clock pulse 8, address bit A20 is transferred at pin SI/SIO0, address bit A21 is transferred at pin SO/SIO1, address bit A22 is transferred at pin WP#/SIO2, and address bit A23 is transferred at pin HOLD#/SIO3. In an embodiment, the memory device obtains data bits associated with the address. In an embodiment, data bits are transferred using pins SI/SIO0, SO/SIO1, WP#/SIO2, and HOLD#/SIO3 simultaneously at falling edges of the clock signal SCLK. For example, at the falling edge of clock pulse 21, data bit D4 is transferred at pin SI/SIO0, data bit D5 is transferred at pin SO/SIO1, data bit D6 is transferred at pin WP#/SIO2, and data bit D7 is transferred at pin HOLD#/SIO3. In a specific embodiment, a 24-bit address can be transferred in six address clock cycles. Similarly, a byte of data, for example D0-D7, can be transferred in two data clock cycles. In an embodiment, a number of configurable wait cycles are provided. The number of wait cycles is specified in a configuration register and can be selected according to the application. In FIG. 9, the configurable wait cycles are shown in clock cycles 14-21. Of course, there can be other variations, modifications, and alternatives.

Figure 10:
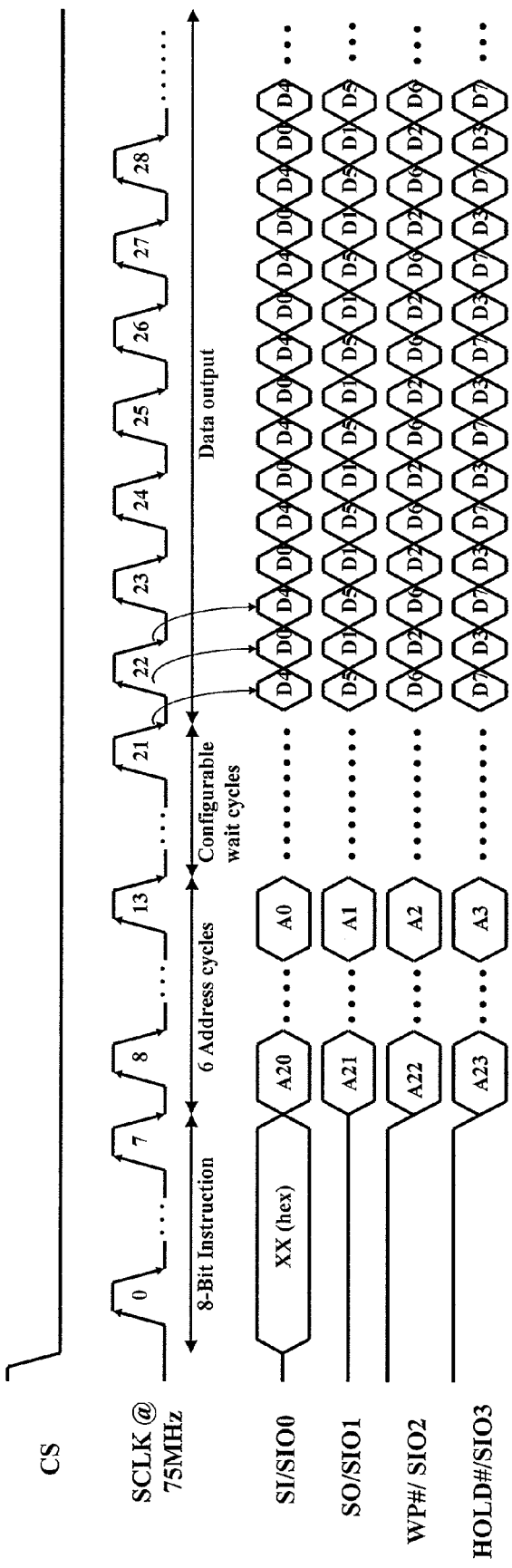
FIG. 10 is a simplified timing diagram for a fast Quadruple I/O SARDDR Read method according to an embodiment of the present invention.

FIG. 10 is a simplified timing diagram for a fast Quadruple I/O SARDDR Read method according to an embodiment of the present invention. This diagram is merely an example, which should not unduly limit the scope of the claims herein. One of ordinary skill in the art would recognize other variations, modifications, and alternatives. As shown, FIG. 10 includes simplified timing diagrams of fast quadruple I/O SARDDR read method for single address rate and double data rate read operation for a serial peripheral interface memory device according to a specific embodiment of the invention. In this specific example, a clock rate of 75 MHz is used. In other embodiments, the clock rate may vary depending on the application. As shown, the CS# (chip select) signal is set to low, and an 8-bit instruction, designated as XX(hex), is transferred using the SI/SIO0 pin. In a specific embodiment, a 24-bit address A0, . . . , A23 is transferred using pin SI/SIO0, pin SO/SIO1, pin WP#/SIO2, and pin HOLD#/SIO3 simultaneously, using rising edges of clock signal SCLK. For example, at the rising edge of clock pulse 8, address bit A20 is transferred at pin SI/SIO0, address bit A21 is transferred at pin SO/SIO1, address bit A22 is transferred at pin WP#/SIO2, and address bit A23 is transferred at pin HOLD#/SIO3. In an embodiment, the memory device obtains data bits associated with the address. In an embodiment, data bits are transferred using pins SI/SIO0, SO/SIO1, WP#/SIO2, and HOLD#/SIO3 simultaneously at falling and rising edges of the clock signal SCLK. For example, at the falling edge of clock pulse 21, data bit D4 is transferred at pin SI/SIO0, data bit D5 is transferred at pin SO/SIO1, data bit D6 is transferred at pin WP#/SIO2, and data bit D7 is transferred at pin HOLD#/SIO3. At the rising edge of clock pulse 22, data bit D0 is transferred at pin SI/SIO0, data bit D1 is transferred at pin SO/SIO1, data bit D2 is transferred at pin WP#/SIO2, and data bit D3 is transferred at pin HOLD#/SIO3. In a specific embodiment, a 24-bit address can be transferred in six address clock cycles, and an 8-bit data byte can be transferred in one data clock cycle. In an embodiment, a number of configurable wait cycles are provided. The number of wait cycles is specified in a configuration register and can be selected according to the application. In FIG. 10, the configurable wait cycles are shown in clock cycles 14-21. Of course, there can be other variations, modifications, and alternatives.

Figure 11:
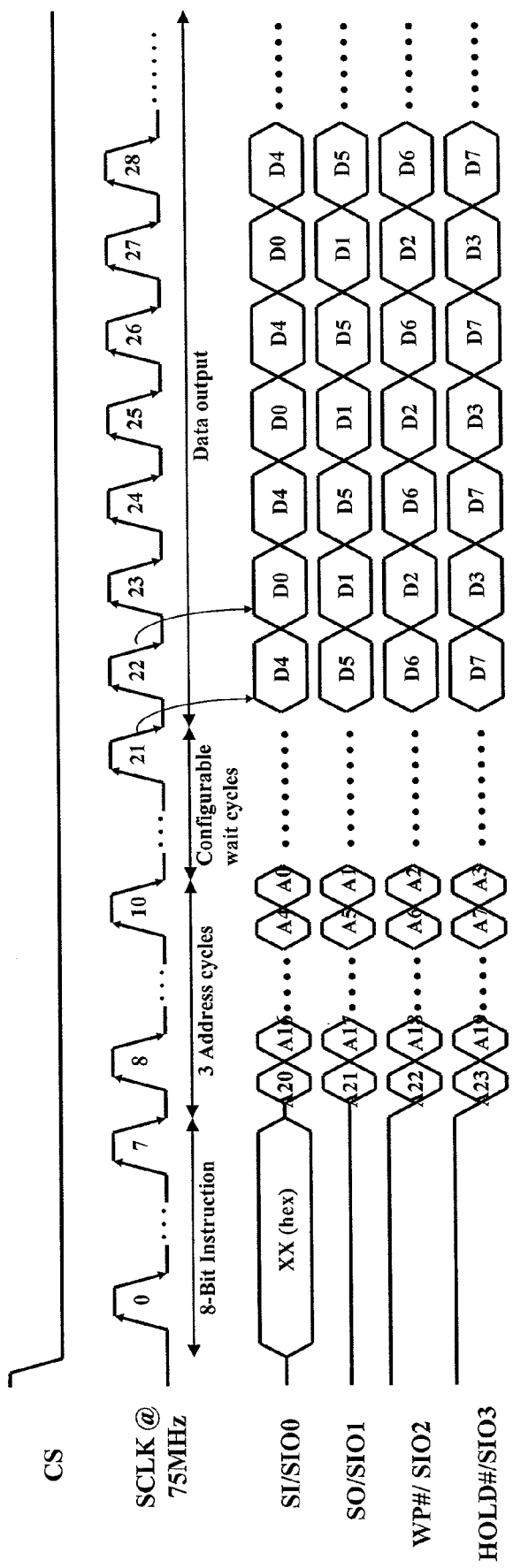
FIG. 11 is a simplified timing diagram for a fast Quadruple I/O DARSDR Read method according to an embodiment of the present invention.

FIG. 11 is a simplified timing diagram for a fast Quadruple I/O DARSDR Read method according to an embodiment of the present invention. This diagram is merely an example, which should not unduly limit the scope of the claims herein. One of ordinary skill in the art would recognize other variations, modifications, and alternatives. As shown, FIG. 11 includes simplified timing diagrams for a fast quadruple I/O double address rate and single data rate read method for a serial peripheral interface memory device according to a specific embodiment of the present invention. In this specific example, a clock rate of 75 MHz is used. In other embodiments, the clock rate may vary depending on the application. As shown, the CS# (chip select) signal is set to low, and an 8-bit instruction, designated as XX(hex), is transferred using the SI/SIO0 pin. In a specific embodiment, a 24-bit address A0, . . . , A23 is transferred using pin SI/SIO0, pin SO/SIO1, pin WP#/SIO2, and pin HOLD#/SIO3 simultaneously, using falling and rising edges of clock signal SCLK. For example, at the rising edge of clock pulse 8, address bit A20 is transferred at pin SI/SIO0, address bit A21 is transferred at pin SO/SIO1, address bit A22 is transferred at pin WP#/SIO2, and address bit A23 is transferred at pin HOLD#/SIO3. At the falling edge of clock pulse 8, address bit A16 is transferred at pin SI/SIO0, address bit A17 is transferred at pin SO/SIO1, address bit A18 is transferred at pin WP#/SIO2, and address bit A19 is transferred at pin HOLD#/SIO3. In an embodiment, the memory device obtains data bits associated with the address. In an embodiment, data bits are transferred using pins SI/SIO0, SO/SO1, WP#/SIO2, and HOLD#/SIO3 simultaneously at falling edge of the clock signal SCLK. For example, at the falling edge of clock pulse 21, data bit D4 is transferred at pin SI/SIO0, data bit D5 is transferred at pin SO/SIO1, data bit D6 is transferred at pin WP#/SIO2, and data bit D7 is transferred at pin HOLD#/SIO3. In a specific embodiment, a 24-bit address can be transferred in three address clock cycles, and an 8-bit data byte can be transferred in two data clock cycles. Therefore, a quadruple I/O double rate transfer can lower the number of needed clock cycles by a factor of eight. In an embodiment, a number of configurable wait cycles are provided. The number of wait cycles is specified in a configuration register and can be selected according to the application. In FIG. 11, the configurable wait cycles are shown in clock cycles 11-21. Of course, there can be other variations, modifications, and alternatives.

Figure 12:
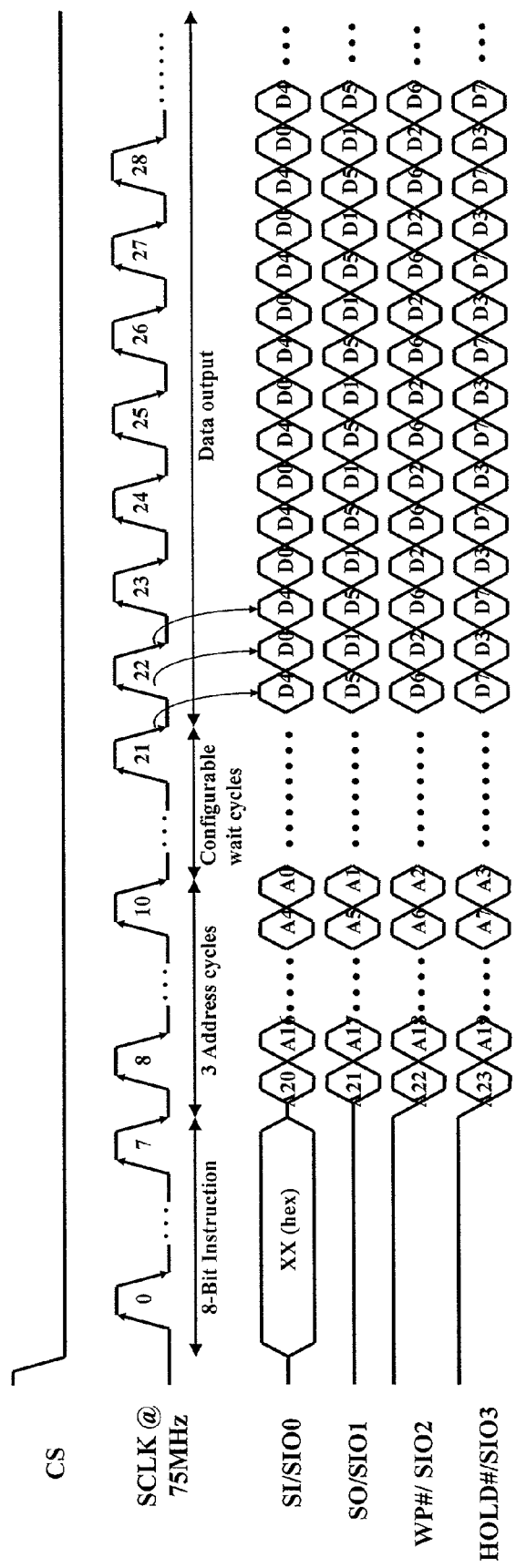
FIG. 12 is a simplified timing diagram for a fast Quadruple I/O DARDDR Read method according to an embodiment of the present invention.

FIG. 12 is a simplified timing diagram for a fast Quadruple I/O DARDDR Read method according to an embodiment of the present invention. This diagram is merely an example, which should not unduly limit the scope of the claims herein. One of ordinary skill in the art would recognize other variations, modifications, and alternatives. As shown, FIG. 12 includes simplified timing diagrams for a fast quadruple I/O double address rate and double data rate read method for a serial peripheral interface memory device according to a specific embodiment of the present invention. In this specific example, a clock rate of 75 MHz is used. In other embodiments, the clock rate may vary depending on the application. As shown, the CS# (chip select) signal is set to low, and an 8-bit instruction, designated as XX(hex), is transferred using the SI/SIO0 pin. In a specific embodiment, a 24-bit address A0, . . . , A23 is transferred using pin SI/SIO0, pin SO/SIO1, pin WP#/SIO2, and pin HOLD#/SIO3 simultaneously, using falling and rising edges of clock signal SCLK. For example, at the rising edge of clock pulse 8, address bit A20 is transferred at pin SI/SIO0, address bit A21 is transferred at pin SO/SIO1, address bit A22 is transferred at pin WP#/SIO2, and address bit A23 is transferred at pin HOLD#/SIO3. At the falling edge of clock pulse 8, address bit A16 is transferred at pin SI/SIO0, address bit A17 is transferred at pin SO/SIO1, address bit A18 is transferred at pin WP#/SIO2, and address bit A19 is transferred at pin HOLD#/SIO3. In an embodiment, the memory device obtains data bits associated with the address. In an embodiment, data bits are transferred using pins SI/SIO0, SO/SIO1, WP#/SIO2, and HOLD#/SIO3 simultaneously at falling and rising edges of the clock signal SCLK. For example, at the falling edge of clock pulse 21, data bit D4 is transferred at pin SI/SIO0, data bit D5 is transferred at pin SO/SIO1, data bit D6 is transferred at pin WP#/SIO2, and data bit D7 is transferred at pin HOLD#/SIO3. At the rising edge of clock pulse 19, data bit D0 is transferred at pin SI/SIO0, data bit D1 is transferred at pin SO/SIO1, data bit D2 is transferred at pin WP#/SIO2, and data bit D3 is transferred at pin HOLD#/SIO3. In a specific embodiment, a 24-bit address can be transferred in three address clock cycles, and an 8-bit data byte can be transferred in one data clock cycle. In an embodiment, a number of configurable wait cycles are provided. The number of wait cycles is specified in a configuration register and can be selected according to the application. In FIG. 12, the configurable wait cycles are shown in clock cycles 11-21. Of course, there can be other variations, modifications, and alternatives.

Figure 13:
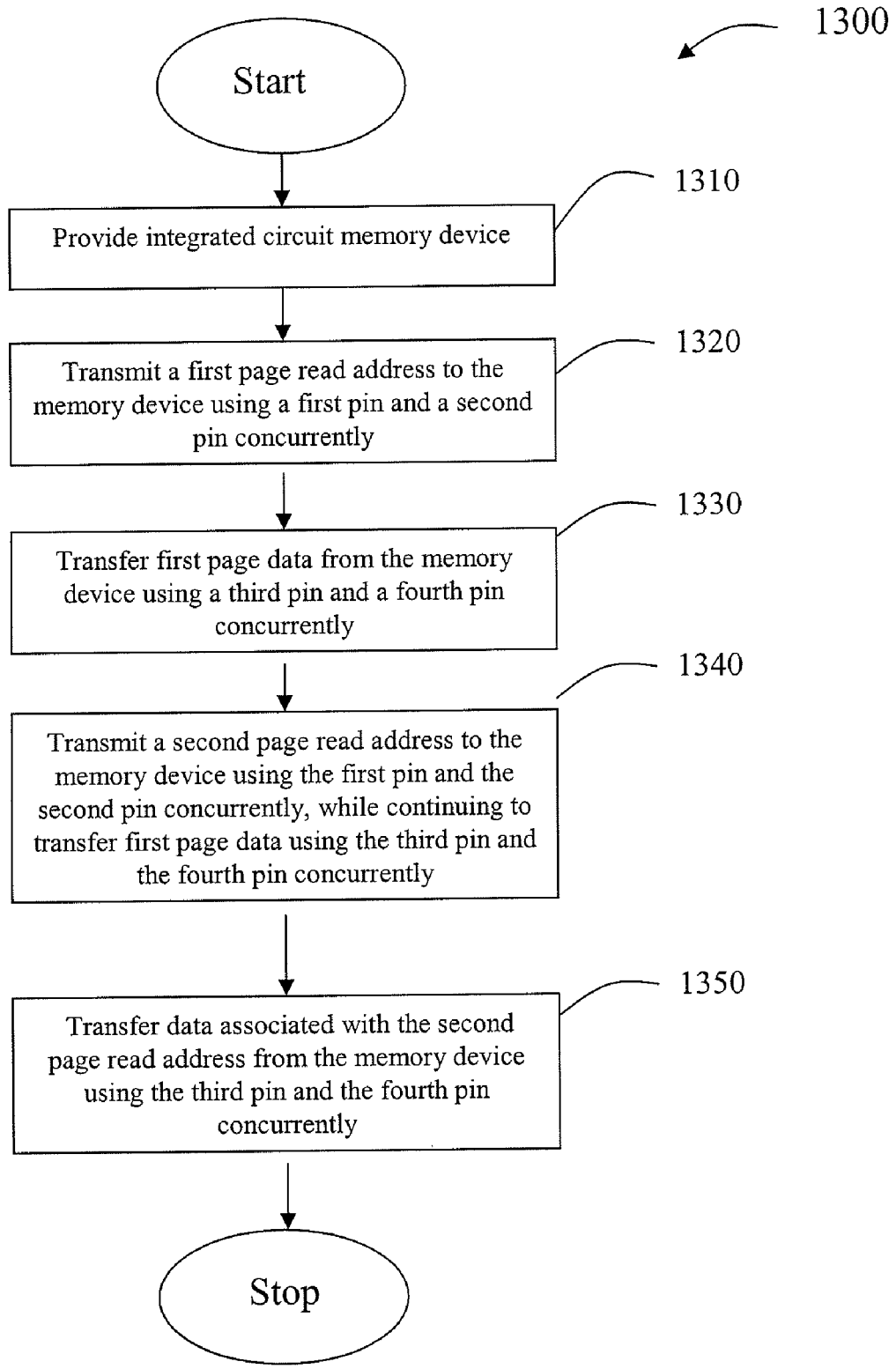
FIG. 13 is a simplified flow chart for a dual I/O memory page read method according to an embodiment of the present invention.

FIG. 13 is a simplified flow chart for a dual I/O memory page read method according to an embodiment of the present invention. This diagram is merely an example, which should not unduly limit the scope of the claims herein. One of ordinary skill in the art would recognize other variations, modifications, and alternatives. As shown, the method for dual I/O memory page read can be briefly outlined below.

1. (Process 1310) Provide an integrated circuit memory device, the memory device including a clock signal and a plurality of pins;
2. (Process 1320) Transmit a first page read address to the memory device using a first pin and a second pin concurrently;
3. (Process 1330) Transfer data from the memory device using a third pin and a fourth pin concurrently;
4. (Process 1340) Transmit a second page read address to the memory device using the first pin and the second pin concurrently, while continuing to transfer the data associated with the first page read address from the memory device using the third pin and the fourth pin concurrently; and
5. (Process 1350) Transfer data associated with the second page read address from the memory device using the third pin and the fourth pin concurrently.

The above sequence of processes provides a dual I/O page read method for a memory device according to an embodiment of the present invention. As shown, the method uses a combination of processes including a way of transmitting page address information using two pins concurrently, while transmitting page data using two different pins concurrently. Other alternatives can also be provided where processes are added, one or more processes are removed, or one or more processes are provided in a different sequence without departing from the scope of the claims herein. Further details of the present method can be found throughout the present specification and more particularly below with reference to FIGS. 14A, 14B, 15A, and 15B.

Figure 14A:
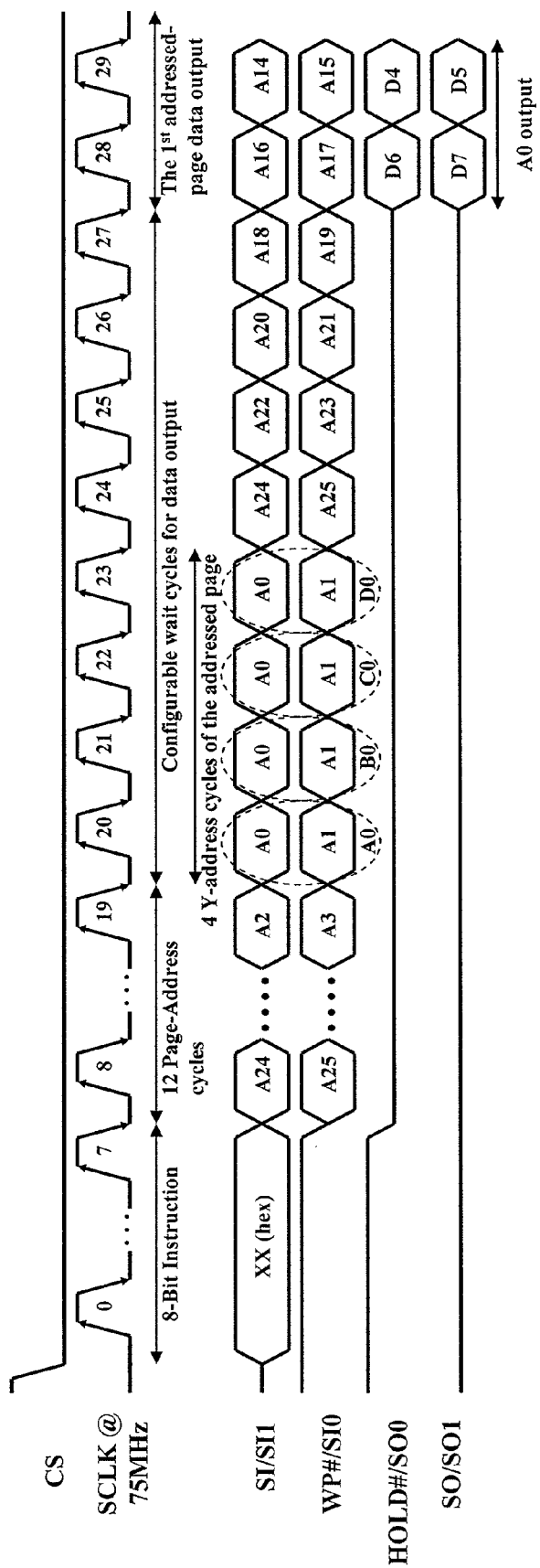
FIGS. 14A and 14B are simplified timing diagrams for a fast Dual I/O SARSDR Page Read method according to an embodiment of the present invention.
Figure 14B:
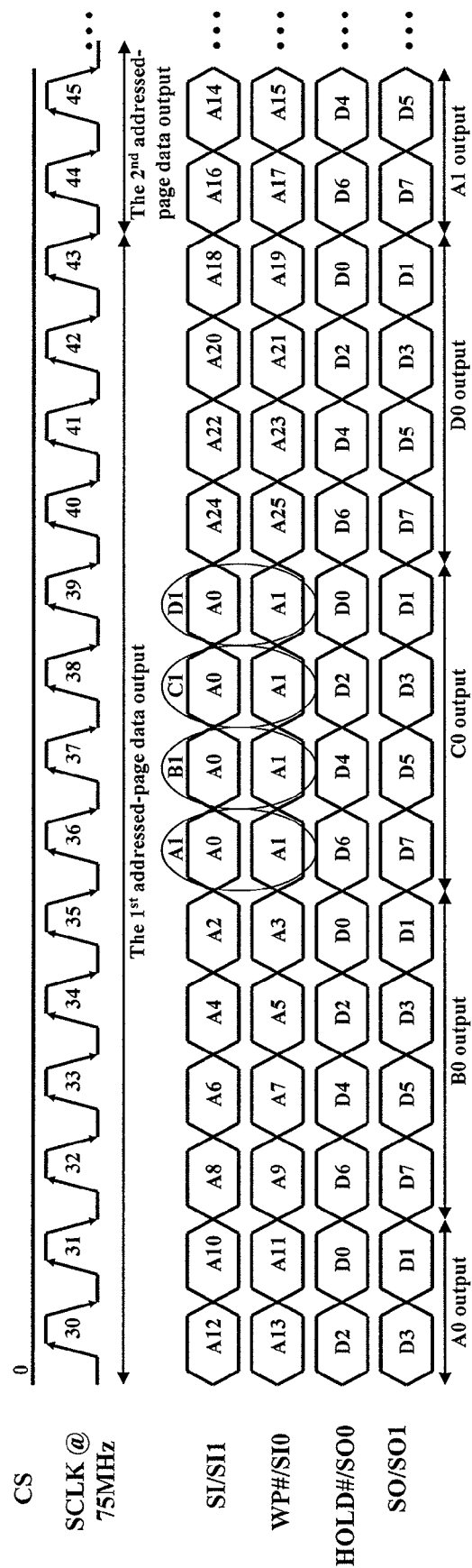

FIGS. 14A and 14B are simplified timing diagrams for a fast Dual I/O SARSDR Page Read method according to an embodiment of the present invention. These diagrams are merely examples, which should not unduly limit the scope of the claims herein. One of ordinary skill in the art would recognize other variations, modifications, and alternatives. As shown, FIGS. 14A and 14B include simplified timing diagrams for a fast dual I/O single address rate and single data rate page read method for a serial peripheral interface memory device according to a specific embodiment of the present invention. In this specific example, a clock rate of 75 MHz is used. In other embodiments, the clock rate may vary depending on the application. As shown, the CS# (chip select) signal is set to low, and an 8-bit instruction, designated as XX(hex), is transferred using the SI/SIO1 pin during clock cycles 0-7. In a specific embodiment, during a 12 page-address clock cycles 8-19, page address bits A25-A2 are transferred using the SI/SI1 and WP#/SI0 pins concurrently. Clock cycles 20-23 are Y-address cycles of the addressed page, during which, Y-addresses A0, B0, C0, and D0 are transferred using pin SI/SI1 and pin WP#/SI0 concurrently. In an embodiment, each of Y-addresses A0, B0, C0, and D0 includes two address bits A0 and A1. Each of Y-addresses A0, B0, C0, and D0 points to a corresponding byte in the addressed page. These Y-addresses allow random access to the data byte within a page. In a specific embodiment, clock cycles 20-27 represent configurable wait cycles for data output. As shown, during clock cycles 24-35, the page address for the second addressed page (A2-A25) starts to be transferred using pins SI/SI1 and WP#/SI0 concurrently. In the particular example shown in FIG. 14A, the first addressed page data output becomes available at clock cycle 27. As shown, the A0 output data bits D0-D7 are transferred using pins HOLD#/SO0 and SO/SO1 simultaneously. For example, D6 and D7 are transferred using pins HOLD#/SO0 and SO/SO1, respectively. Similarly, the A0 output data bits D4 and D5 are transferred using pins HOLD#/SO0 and SO/SO1, respectively. As shown in FIG. 14B, data bits for B0 output, C0 output, and D0 output in the first addressed page are transferred using pins HOLD#/SO0 and SO/SO1 concurrently. In clock cycles 36-39 are Y-address cycles of the second addressed page, A1, B1, C1, and D1 (each of which includes two address bits A0 and A1) are transferred using pin SI/SI1 and pin WP#/SI0. After the transfer address bits for the second addressed page are finished, the address bits for the next addressed page are transferred, starting in clock cycle 40. As shown in FIG. 14B, the first available data bits for the second addressed page, the A1 output, are transferred during clock cycle 43. According to a specific embodiment of the dual I/O SARSDR page read method, address bits for an addressed page and the data bits for another addressed page are transferred concurrently. The address bits are transferred using pins SI/SI1 and WP#/SI0 concurrently, and the data bits are transferred using pins HOLD#/SO0 and SO/SO1 concurrently. Depending on the particular application, falling edges or rising edges of clock signals can be used to trigger address and data transfer. Of course, there can be other variations, modifications, and alternatives.

Figure 15A:
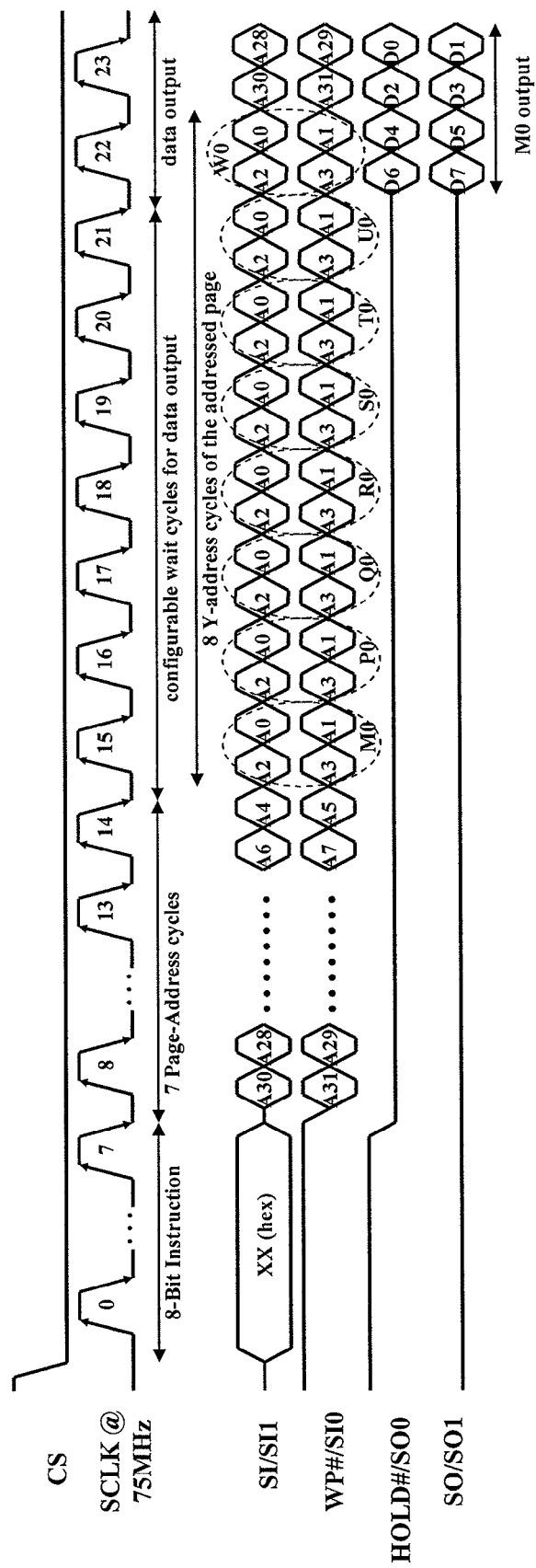
FIGS. 15A and 15B are simplified timing diagrams for a fast Dual I/O DARDDR Page Read method according to an embodiment of the present invention.
Figure 15B:
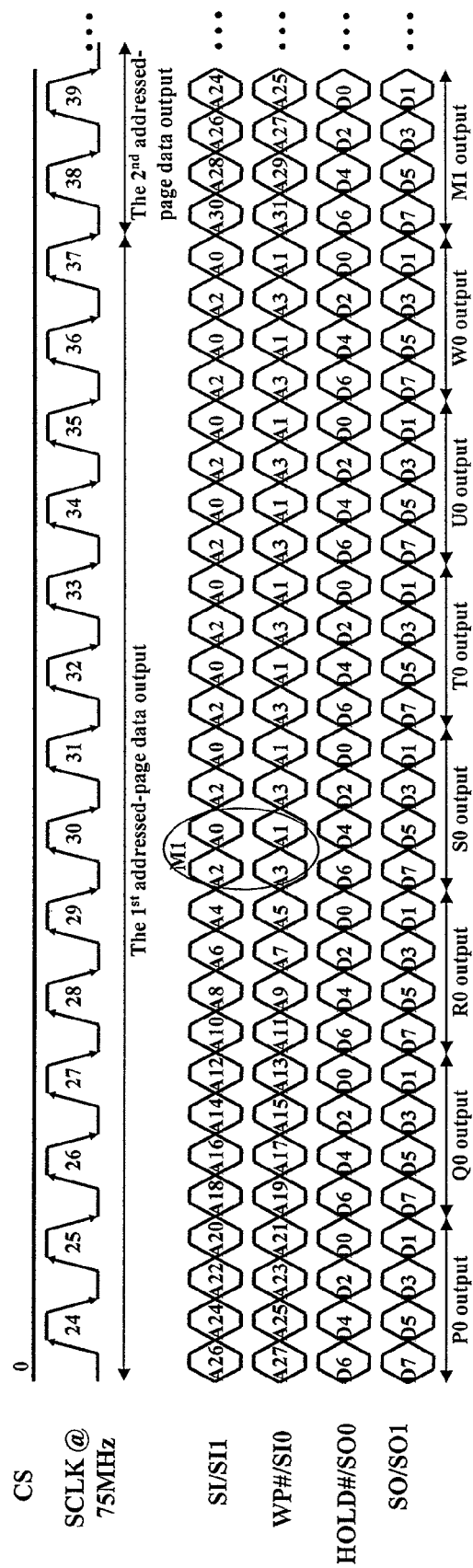

FIGS. 15A and 15B are simplified timing diagrams for a fast Dual I/O DARDDR Page Read method according to an embodiment of the present invention. These diagrams are merely examples, which should not unduly limit the scope of the claims herein. One of ordinary skill in the art would recognize other variations, modifications, and alternatives. As shown, FIGS. 15A and 15B include simplified timing diagrams for a fast dual I/O double address rate and double data rate page read method for a serial peripheral interface memory device according to a specific embodiment of the present invention. In an embodiment of the dual I/O DARDDR page read method, address bits and data bits are transferred concurrently using both rising and falling edges of clock signal SCLK, the address bits using pins SI/SI1 and WP#/SI0, and the data bits using pins HOLD#/SO0 and SO/SO1. The operation of this embodiment is similar to that described in FIGS. 14A and 14B for a fast dual I/O single address rate and single data rate page read method. In the embodiment shown in FIGS. 15A and 15B, the address and data bit transfer can be twice as fast by using both falling and rising edges of the clock signal. In this specific example, a clock rate of 75 MHz is used. In other embodiments, the clock rate may vary depending on the application. Of course, there can be other variations, modifications, and alternatives.

Figure 16A:
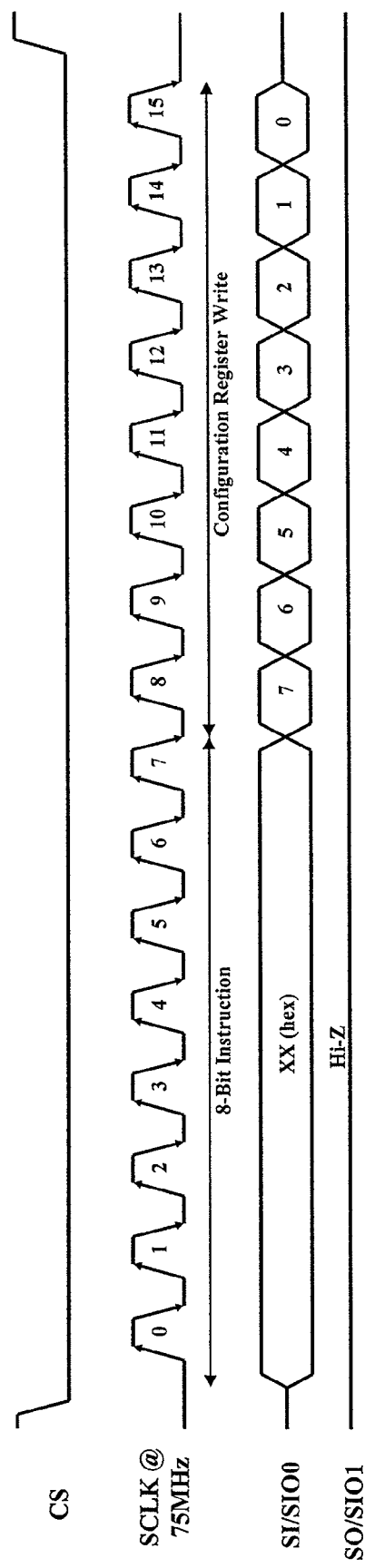
FIG. 16A is a simplified timing diagram of Configuration Register write method according to an embodiment of the present invention.

FIG. 16A is a simplified timing diagram of Configuration Register write method according to an embodiment of the present invention. This diagram is merely an example, which should not unduly limit the scope of the claims herein. One of ordinary skill in the art would recognize other variations, modifications, and alternatives. As shown, the CS# (chip select) signal is set to low, and an 8-bit instruction, designated as XX(hex), is transferred using the SI/SIO0 pin during clock cycles 0-7. In a specific embodiment, during clock cycles 8-15, the configuration register bits 7-0 are written using the SI/SIO0 pin. In a specific embodiment, the SO/SIO1 pin is held in a high-impedance state Hi-z. Of course, there can be other variations, modifications, and alternatives.

FIG. 16B is a simplified diagram of a configuration register bit assignment according to an embodiment of the present invention. This diagram is merely an example, which should not unduly limit the scope of the claims herein. One of ordinary skill in the art would recognize other variations, modifications, and alternatives. A specific example of the configuration register is shown in Table II below. As shown, bits 0-7 of the configuration register are used for indicating parameters used in a memory device according to an embodiment of the invention.

TABLE II

| Bit | Purpose | Description |
| --- | --- | --- |
| 7-4 | Dummy cycle count | 0001: 1 dummy cycle, 0010: 2 dummy cycles, 0011: 3 dummy cycles, 0100: 4 dummy cycles, 0101: 5 dummy cycles, 0110: 6 dummy cycles, 0111: 7 dummy cycles, 1000: 8 dummy cycles (default) |
| 3-1 | Burst length | 000: 4-byte burst, 001: 8-byte burst, 010: 16-byte burst, 100: 32-byte burst, 111: continuous burst |
| 0 | Wrap around | 0: Wrap around, 1: No wrap around (default) |

In a specific embodiment, bits 4-7 provide the number of dummy cycles used in, for example, configurable wait cycles included in the embodiments discussed above. In the specific embodiment shown in FIG. 16B, dummy cycles range from 1-8 clock cycles are provided. Depending on the embodiments, bits 4-7 of the configuration register can be used to specify 16 different clock cycles for the wait cycles or dummy cycles. In an embodiment, bits 0-3 are used to designate options in a burst read operation. For example, bits 1-3 indicate the length of data transfer, and bit 0 indicates optional wrap around in burst mode. Of course, other variations, modifications, and alternatives can be envisioned b one skilled in the art in view of this disclosure.

Figure 17:
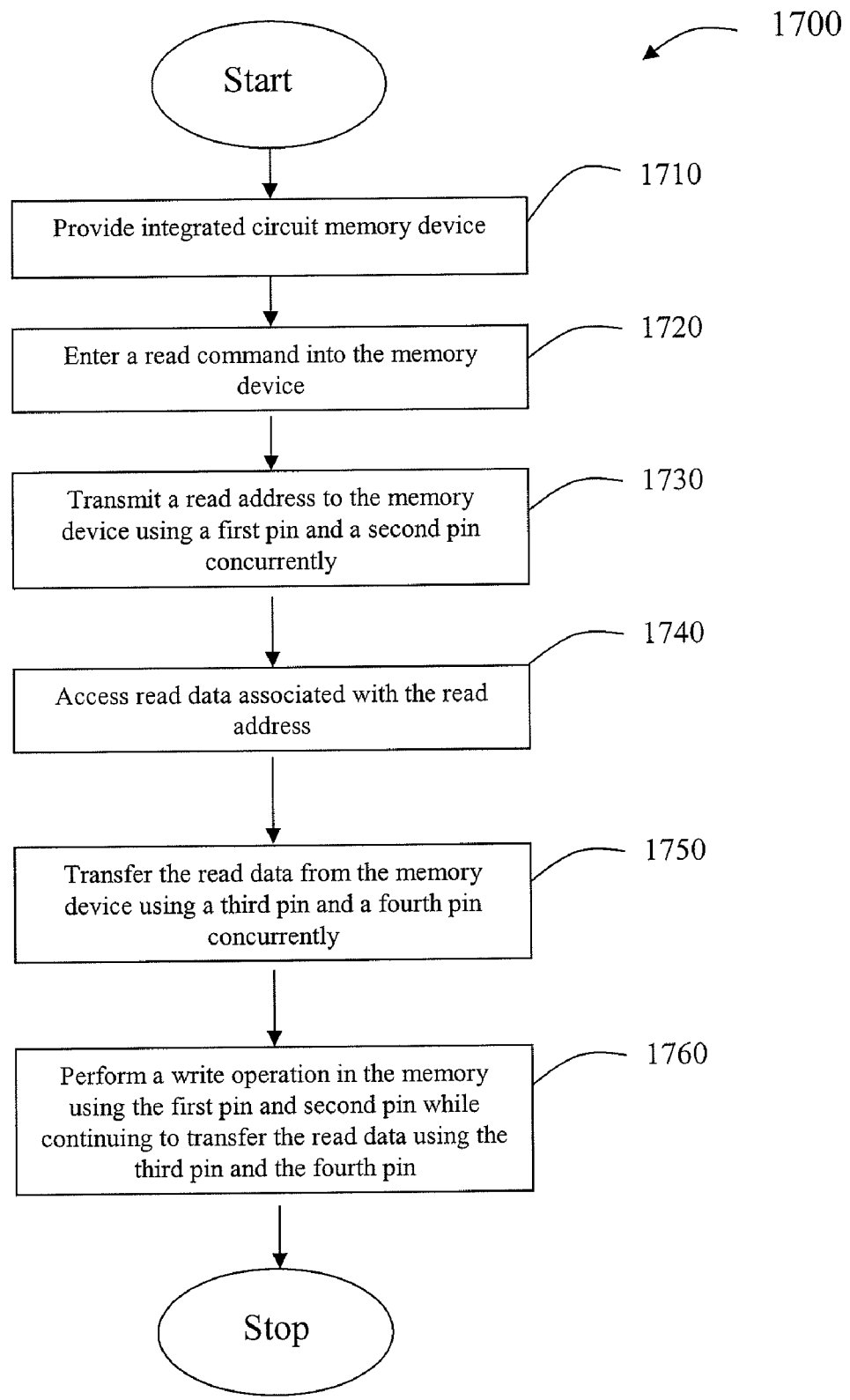
FIG. 17 is a simplified flow chart for a method for dual I/O memory burst read with simultaneous read/write (SRW) according to an embodiment of the present invention.

FIG. 17 is a simplified flow chart for a method for dual I/O memory burst read with simultaneous read/write (SRW) according to an embodiment of the present invention. This diagram is merely an example, which should not unduly limit the scope of the claims herein. One of ordinary skill in the art would recognize other variations, modifications, and alternatives. As shown, a method for dual I/O burst read with SRW can be briefly outlined below.

1. (Process 1710) Provide an integrated circuit memory device;
2. (Process 1720) Enter a read command into the memory device;
3. (Process 1730) Transmit a read address to the memory device using a first pin and a second pin concurrently;
4. (Process 1740) Access read data associated with the read address;
5. (Process 1750) Transfer the read data from the memory device using a third pin and a fourth pin concurrently; and
5. (Process 1760) Perform a write operation in the memory using the first pin and second pin while continuing to transfer the read data using the third pin and the fourth pin. The write operation including at least one of the following processes:
   a. Enter a write command into the memory;
   b. Transfer a write address to the memory device using the first pin and the second pin concurrently;
   c. Transfer write data to the memory device using the first pin and the second pin concurrently; and
   d. Write data to the memory device in the memory location associated with the write address.

The above sequence of processes provides a method dual I/O burst read with simultaneous read/write (SRW) for a memory device according to an embodiment of the present invention. As shown, the method uses a combination of processes including a way of transferring burst read data while writing program data using different pins. Other alternatives can also be provided where processes are added, one or more processes are removed, or one or more processes are provided in a different sequence without departing from the scope of the claims herein. Further details of the present method can be found throughout the present specification and more particularly below with reference to FIGS. 18A-18D.

FIGS. 18A, 18B, 18C and 18D are simplified timing diagrams of a method for fast Dual I/O Burst Read with SRW according to an embodiment of the present invention. These diagrams are merely examples, which should not unduly limit the scope of the claims herein. One of ordinary skill in the art would recognize other variations, modifications, and alternatives. As shown, FIGS. 18A, 18B, 18C and 18D include simplified timing diagrams for a fast dual I/O burst read with simultaneous read write method for a serial peripheral interface memory device according to a specific embodiment of the present invention. In this specific example, a clock rate of 75 MHz is used. In other embodiments, the clock rate may vary depending on the application. This example includes burst length of four bytes with the wrap around optioned selected. The example also includes configurable wait cycles. In an embodiment, the configurable wait cycles, the burst data length and optional wrap around are designated by the configuration register as discussed above with reference to Table II.

Figure 18A:
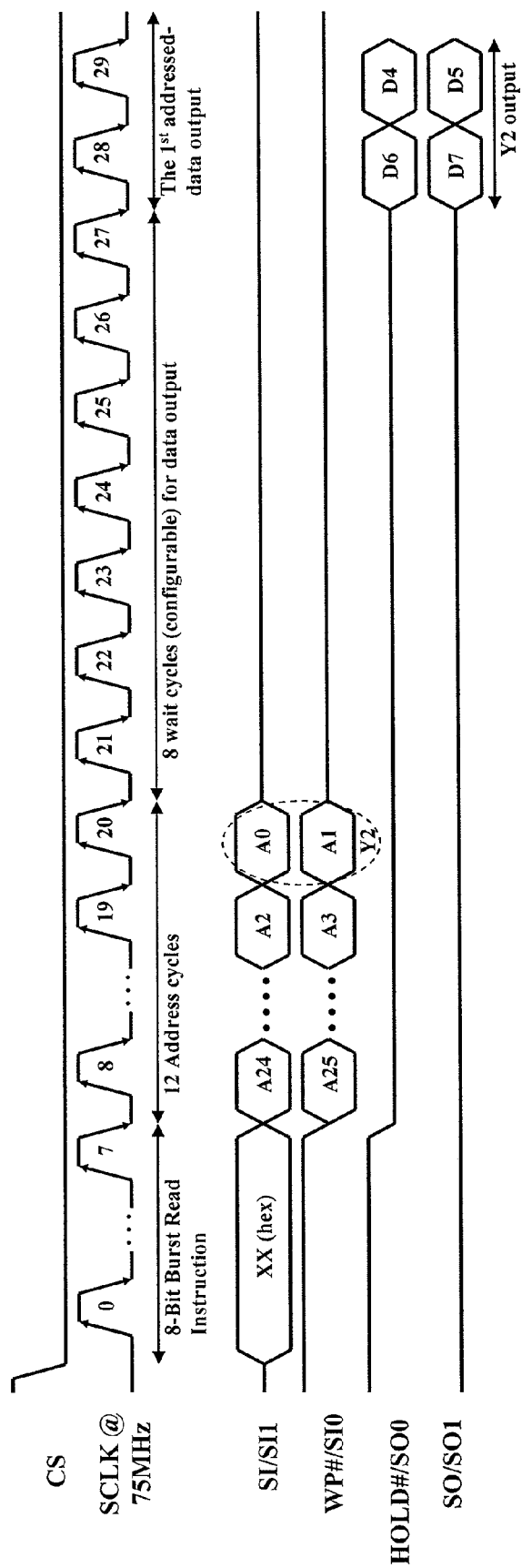
FIGS. 18A, 18B, 18C and 18D are simplified timing diagrams of a method for fast Dual I/O Burst Read with SRW according to an embodiment of the present invention.
Figure 18B:
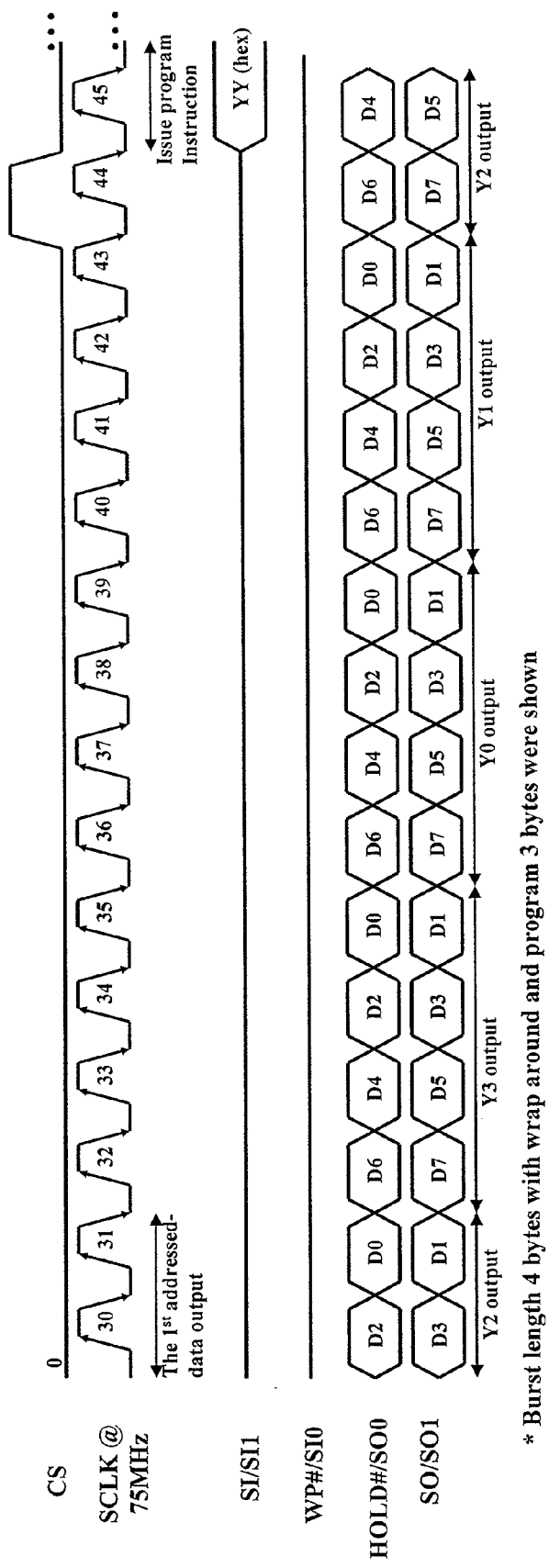
Figure 18C:
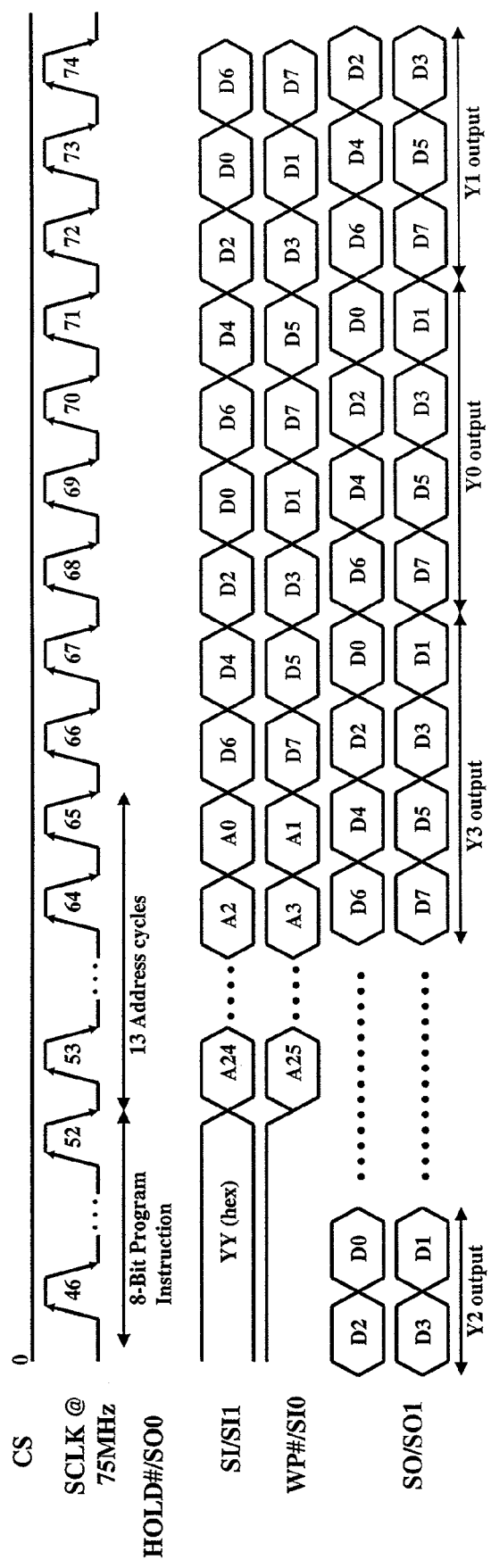
Figure 18D:
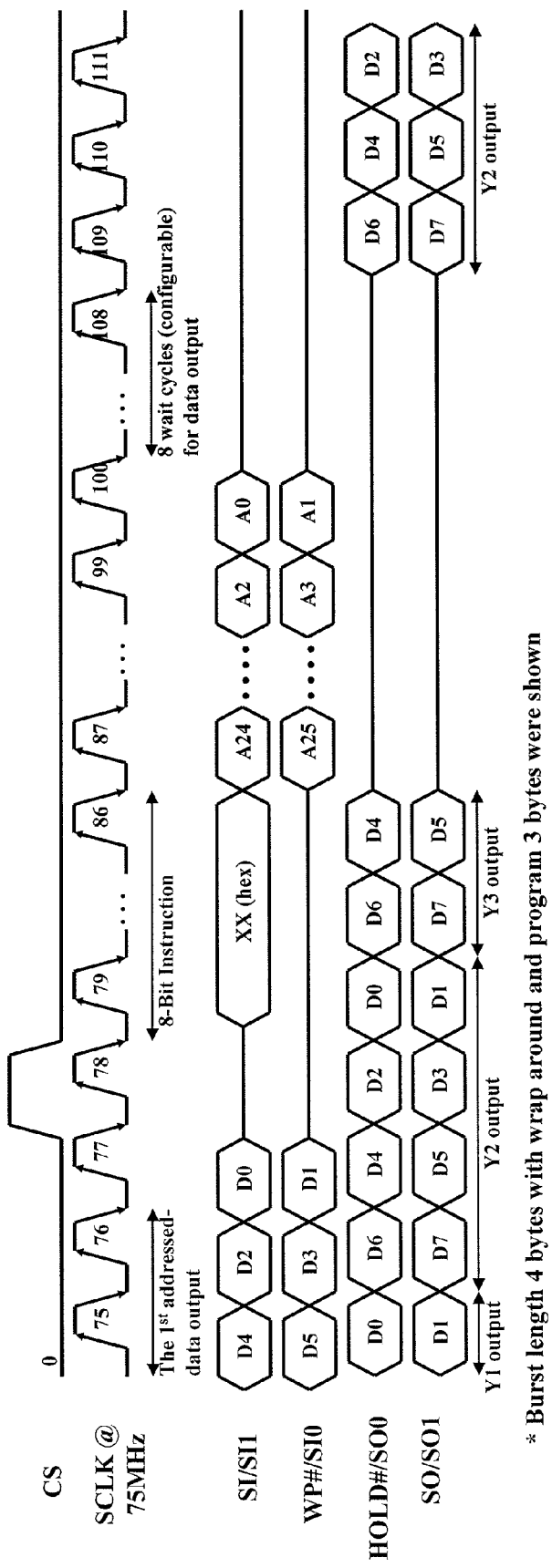

Referring to FIG. 18A, the CS# (chip select) signal is set to low, and an 8-bit Burst Read instruction, designated as XX(hex), is transferred using the SI/SIO0 pin during clock cycles 0-7. In a specific embodiment, during clock cycles 8-20, address bits A0-A25 are transferred using the SI/SI1 and WP#/SI0 pins. In a specific embodiment, clock cycles 21-27 represent configurable wait cycles for data output. In the particular example shown in FIG. 18A, the first data output becomes available at the falling edge of clock cycle 27. As shown, the Y2 output data bits D0-D7 are transferred using pins HOLD#/SO0 and SO/SO1 simultaneously. For example, D6 and D7 are transferred using pins HOLD#/SO0 and SO/SO1, respectively. Similarly, the Y2 output data bits D4 and D5 are transferred using pins HOLD#/SO0 and SO/SO1, respectively. As shown in FIG. 18B, data bits for Y3 output, Y0 output, and Y1 output, etc., are transferred using pins HOLD#/SO0 and SO/SO1. In an embodiment of a simultaneously write operation can be performed while a read operation is being conducted. Referring to FIG. 18B, the CS# (chip select) signal is raised to high at the falling edge of clock pulse 43 and then lowered at the falling edge of clock signal 44, at which time an 8-bit program instruction, designated as YY(hex), is transferred using the SI/SIO0 pin during clock cycles 45-52. FIGS. 18C and 18D include timing diagrams for subsequent clock cycles. In a specific embodiment, during clock cycles 53-65, address bits A0-A25 for the program instruction are transferred using the SI/SI1 and WP#/SI0 pins. Starting from clock cycle 65, data bits for the program instruction are transferred using the SI/SI1 and WP#/SI0 pins. When the program instruction, address, and data bits are being transferred using the SI/SI1 and WP#/SI0 pins, the burst mode read data transfer continues using pins HOLD#/SO0 and SO/SO1. Simultaneous read and write operations can therefore be performed according to embodiments of the present invention.

As shown in FIG. 18D, at clock cycle 79, the CS# signal starts another 8-bit instruction, for example a read operation. In an embodiment, the simultaneous read/write method described above can be used to perform simultaneously read/write operations. For example, the 8-bit program instruction YY(hex) can be replaced by an erase instruction. The erase operation can then be carried out simultaneously with a read operation. Of course, there can be other variations, modifications, and alternatives.

Figures 19A, 19B:
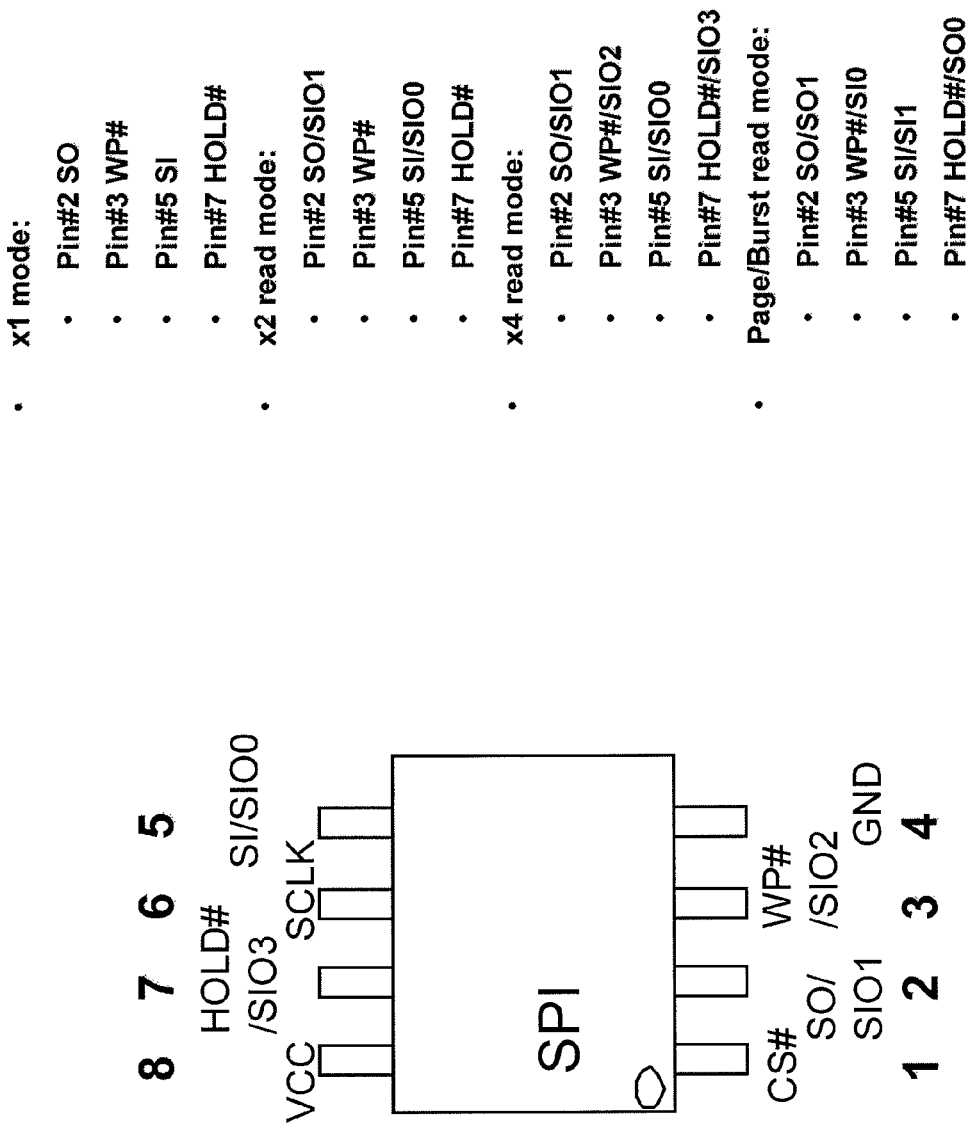
FIG. 19A is a simplified pin out diagram for an integrated circuit which includes a serial peripheral interface I/O according to an embodiment of the present invention.
FIG. 19B is a simplified list of pin assignments for an integrated circuit which includes a serial peripheral interface I/O according to an embodiment of the present invention.

FIG. 19A is a simplified pin out diagram for an integrated circuit which includes a serial peripheral interface I/O according to an embodiment of the present invention. This diagram is merely an example, which should not unduly limit the scope of the claims herein. One of ordinary skill in the art would recognize other variations, modifications, and alternatives. FIG. 19A is similar to FIG. 1A. As shown, serial memory device include pin #1 CS# (chip select), pin #2 SO (serial data out), pin #3 WP# (write protect), pin #4 GND (ground), pin #5 SI (serial data in), pin #6 SCLK (clock), pin #7 HOLD# (hold), and pin #8 VCC (power supply) according to a specific embodiment of the invention. In certain embodiments, pin #2 is designated at SO/SIO1, pin #3 is designated as WP#/SIO2, pin 5 is designated as SI/SIO0, and pin #7 is designated as HOLD#/SIO3. In other embodiments, pin #2 is designated at SO/SO1, pin #3 is designated as WP#/SI0, pin 5 is designated as SI/SI1, and pin #7 is designated as HOLD#/SO0.

FIG. 19B is a simplified list of pin assignments for an integrated circuit which includes a serial peripheral interface I/O according to an embodiment of the present invention. This diagram is merely an example, which should not unduly limit the scope of the claims herein. One of ordinary skill in the art would recognize other variations, modifications, and alternatives. As shown, pins #2, #3, #5, and #7 are assigned different names according to their functions, some of which have been discussed above. For example, as summarized in the list below, x1 mode refers to single I/O operations, x2 read mode refers to dual I/O operations, x4 read mode refers to quad I/O operations, and Page/Burst read mode refers page and burst mode operations, respectively.

x1 mode:
Pin#2 SO
Pin#3 WP#
Pin#5 SI
Pin#7 HOLD#
x2 read mode:
Pin#2 SO/SIO1
Pin#3 WP#
Pin#5 SI/SIO0
Pin#7 HOLD#
x4 read mode:
Pin#2 SO/SIO1
Pin#3 WP#/SIO2
Pin#5 SI/SIO0
Pin#7 HOLD#/SIO3
Page/Burst read mode:
Pin#2 SO/SO1
Pin#3 WP#/SI0
Pin#5 SI/SI1
Pin#7 HOLD#/SO0

Although the above has been shown using a selected group of components, pin configuration, and timing sequences for the serial peripheral interface methods for memory device according to embodiments of the present invention, there can be many alternatives, modifications, and variations. For example, some of the pin assignments and functions can be interchanged or modified. Depending upon the embodiment, the arrangement of timing sequence may be altered. As another example, the use of falling and rising clock edges may be interchanged and modified. Many other variations, modifications, and alternatives can be implemented by one skilled in the art in view of this disclosure. For example, the invention can be applied to other memory devices such DRAM, SRAM, parallel flash, or other non-volatile memories, etc.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An integrated circuit device comprising:
   a serial peripheral interface adapted for receiving a first command supporting an address of a first configuration, wherein the serial peripheral interface supports an address of a second configuration upon receipt of a second command, the second configuration being different from the first configuration, wherein the serial peripheral interface receives a first read address through a plurality of pins comprising a first input pin and a second input pin.

2. The integrated circuit device of claim 1, wherein the first and the second configurations are different in address length.

3. The integrated circuit device of claim 1, wherein a second address cooperated with the second command has a first part and a second part, the second part comprising a plurality of byte addresses, each of the byte addresses being associated with a corresponding byte of data.

4. The integrated circuit device of claim 1 further comprising:
   a mode logic circuit for controlling operations of the first command and the second command.

5. The integrated circuit device of claim 1, wherein the serial peripheral interface further transfers data through a plurality of pins comprising a first output pin and a second output pin.

6. The integrated circuit device of claim 5, wherein the serial peripheral interface further receives a second read address through the first input pin and the second input pin, while continuing to transfer data associated with the first read address.

7. The integrated circuit device of claim 1, wherein the serial peripheral interface transfers data through a plurality of pins comprising a first output pin and a second output pin.

8. The integrated circuit device of claim 1, further comprising:
   a configuration register for setting a length of data to be transferred in a burst mode operation.

9. The integrated circuit device of claim 8, wherein the serial peripheral interface further receives a program command while transferring data in the burst mode.

10. A method for operating an integrated circuit device comprising a serial peripheral interface, the method comprising steps of:
    receiving, through the serial peripheral interface which is compliant with a first command for supporting an address of a first configuration, a second command; and
    receiving, through the serial peripheral interface, an address of a second configuration, wherein the second configuration is different from the first configuration,
    wherein the serial peripheral interface receives a first read address through a plurality of pins comprising a first input pin and a second input pin.

11. The method of claim 10, wherein the first and the second configurations are different in address length.

12. The method of claim 10, wherein the address of the second configuration comprises a first part associated with a first memory segment and a second part associated with a second memory segment within the first memory segment.

13. The method of claim 12, wherein the second memory segment is a byte.

14. The method of claim 10, wherein the serial peripheral interface further transfers data through a plurality of pins comprising a first output pin and a second output pin.

15. The method of claim 14, wherein the serial peripheral interface further receives a second read address through the first input pin and the second input pin, while continues to transfer data associated with the first read address.

16. The method of claim 10, wherein the serial peripheral interface transfers data through a plurality of pins comprising a first output pin and a second output pin.

17. The method of claim 16, further comprising a step of:
    receiving a program command while transferring data in the burst mode operation.

18. The method of claim 10, further comprising a step of:
    setting a configuration register of the integrated circuit device to determine a length of data to be transferred in a burst mode operation.

19. An integrated circuit device comprising:
    an interface adapted to optionally receive a first command followed by an address of a first configuration or a second command followed by an address of a second configuration different from the first configuration, wherein the serial peripheral interface receives a first read address through a plurality of pins comprising a first input pin and a second input pin.

20. The integrated circuit device of claim 19, wherein the first and the second configurations are different in address length.

21. The integrated circuit device of claim 19 further comprising:
    a mode logic circuit for controlling operation of the first command and the second command.

22. The integrated circuit device of claim 19, wherein the interface further transfers data through a plurality of pins comprising a first input pin and a second input pin.

23. The integrated circuit device of claim 22, wherein the interface further receives a second read address through the first input pin and the second input pin, while continues to transfer data associated with the first read address.

24. The integrated circuit device of claim 19, wherein the interface transfers data through a plurality of pins comprising a first output pin and a second output pin.

25. The integrated circuit device of claim 19, further comprising:
    a configuration register for setting a length of data to be transferred in a burst mode operation.

26. The integrated circuit device of claim 25, wherein the interface further receives a program command while transfers data in the burst mode.

* * * * *